United States Patent
Nakatani et al.

(10) Patent No.: US 7,292,417 B2
(45) Date of Patent: *Nov. 6, 2007

(54) MAGNETIC APPARATUS WITH PERPENDICULAR RECORDING MEDIUM AND HEAD HAVING MULTILAYERED REPRODUCING ELEMENT USING TUNNELING EFFECT

(75) Inventors: Ryoichi Nakatani, Akigawa (JP); Masahiro Kitada, Tokyo (JP); Hisashi Takano, Hachioji (JP); Hideo Tanabe, Higashimurayama (JP); Noboru Shimizu, Tokorozawa (JP)

(73) Assignee: Hitachi Global Storage Technologies Japan, Ltd., Odawara-shi ( * ) Notice: Subject to any disclaimer, the term of this patent is extended or adjusted under 35 U.S.C. 154(b) by 0 days.

This patent is subject to a terminal disclaimer.

(21) Appl. No.: 11/543,210

(22) Filed: Oct. 5, 2006

(65) Prior Publication Data

US 2007/0030604 A1 Feb. 8, 2007

Related U.S. Application Data

(63) Continuation of application No. 11/371,244, filed on Mar. 9, 2006, now Pat. No. 7,159,303, which is a continuation of application No. 10/700,500, filed on Nov. 5, 2003, now Pat. No. 7,054,120, which is a continuation of application No. 10/270,120, filed on Oct. 15, 2002, now Pat. No. 6,687,099, which is a continuation of application No. 09/931,897, filed on Aug. 20, 2001, now Pat. No. 6,483,677, which is a continuation of application No. 09/468,309, filed on Dec. 21, 1999, now Pat. No. 6,278,593, which is a continuation of application No. 08/626,333, filed on Apr. 2, 1996, now Pat. No. 6,011,674, which is a continuation of application No. 08/328,090, filed on Oct. 24, 1994, now Pat. No. 5,726,837, which is a continuation of application No. 07/710,775, filed on Jun. 5, 1991, now Pat. No. 5,390,061.

(30) Foreign Application Priority Data

| Jun. 8, 1990 | (JP) | 02-148643 |
| Aug. 22, 1990 | (JP) | 02-218894 |
| Aug. 22, 1990 | (JP) | 02-218904 |
| Sep. 14, 1990 | (JP) | 02-242341 |

(51) Int. Cl.
 *G11B 5/39* (2006.01)

(52) U.S. Cl. .................................. 360/324.2
(58) Field of Classification Search .............. 360/324.2
 See application file for complete search history.

(56) References Cited

U.S. PATENT DOCUMENTS

| 2,683,856 A | 7/1954 | Kornei |
| 3,813,692 A | 5/1974 | Brock et al. |
| 4,012,781 A | 3/1977 | Lin |
| 4,040,113 A | 8/1977 | Gorter |
| 4,103,315 A | 7/1978 | Hempstead et al. |
| 4,142,218 A | 2/1979 | Gorter |
| 4,443,826 A | 4/1984 | Sawada et al. |
| 4,593,332 A | 6/1986 | Akiyama et al. |
| 4,639,806 A | 1/1987 | Kira et al. |
| 4,663,685 A | 5/1987 | Tsang |
| 4,780,848 A | 10/1988 | Daughton et al. |
| 4,803,580 A | 2/1989 | Mowry |
| 4,825,325 A | 4/1989 | Howard |
| 4,881,143 A | 11/1989 | Bhattacharyya et al. |
| 4,894,741 A | 1/1990 | French |
| 4,896,235 A | 1/1990 | Takino et al. |
| 4,940,511 A | 7/1990 | Fontana, Jr. et al. |
| 4,949,039 A | 8/1990 | Grünberg |
| 4,987,509 A | 1/1991 | Gill et al. |
| 5,014,147 A | 5/1991 | Parkin et al. |
| 5,027,243 A | 6/1991 | Gill et al. |
| 5,132,859 A | 7/1992 | Andricados et al. |
| 5,134,533 A | 7/1992 | Friedrich et al. |
| 5,159,513 A | 10/1992 | Dieny et al. |
| 5,206,590 A | 4/1993 | Dieny et al. |
| 5,216,560 A | 6/1993 | Brug et al. |
| 5,390,061 A | 2/1995 | Nakatani et al. |
| 5,726,837 A | 3/1998 | Nakatani et al. |

| | | |
|---|---|---|
| 6,011,674 A | 1/2000 | Nakatani et al. |
| 6,278,593 B1 | 8/2001 | Nakatani et al. |
| 6,483,677 B2 | 11/2002 | Nakatani et al. |
| 6,687,099 B2 | 2/2004 | Nakatani et al. |
| 7,054,120 B2* | 5/2006 | Nakatani et al. ......... 360/324.2 |
| 7,159,303 B2* | 1/2007 | Nakatani et al. ......... 360/324.2 |

FOREIGN PATENT DOCUMENTS

| | | |
|---|---|---|
| JP | 51-44917 | 4/1976 |
| JP | 52-023925 | 2/1977 |
| JP | 53-17404 | 6/1978 |
| JP | 57-177573 | 11/1982 |
| JP | 58-004931 | 1/1983 |
| JP | 63-055714 | 3/1988 |
| JP | 01-213819 | 8/1989 |
| JP | 2-61572 | 3/1990 |

OTHER PUBLICATIONS

Takino et al., Magneto-Resistance Effect Type Magnetic Head, Published Mar. 10, 1988, Certified Translation of Japanese Patent Application Publication JP 63-055714 A.*

Proceedings of the International Symposium on Physics of Magnetic Materials, Apr. 8-11, 1987, pp. 303-306, Suezawa et al.

Journal of Applied Physics, vol. 66(9), pp. 4338-4344, Nov. 1989, "Changes in Soft Magnetic Properties of Fe Multilayered Films due to Lattice Mismatches between Fe and Intermediate Layers", Nakatani et al.

Physical Review Letters, vol. 61, No. 21, pp. 2472-2475 (1988), Baibich et al.

Physical Review B, vol. 39, No. 10, pp. 6995-7002, "Conductive and Exchange Coupling of Two Ferromagnets Separated by a Tunneling Barrier", Apr. 1989, Slonczewski.

Pratt et al., "Giant Magnetoresistance with Current Perpendicular to the Layer Planes of Ag/Co and AgSn/Co Mutlilayers (invited)", J. Appl. Phys., vol. 73, No. 10, May 15, 1993, pp. 5326-5331.

S. Maekawa et al., "Electron Tunneling Between Ferromagnetic Films", IEEE Transactions on Magnetics, vol. MAG-18, No. 2, Mar. 1982, pp. 707-708.

Hirai et al., "Josephson Device", Ohm Corp., Feb. 28, 1978, pp. 121-122.

"Ferromagnetic Tunneling Junction", vol. 15, No. 3, 1980, pp. 171-176, 198, and 781-782.

* cited by examiner

*Primary Examiner*—Craig A. Renner
(74) *Attorney, Agent, or Firm*—Mattingly, Stanger, Malur & Brundidge, P.C.

(57) ABSTRACT

The magnetoresistance effect element is of a multilayered structure having at least magnetic layers and an intermediate layer of an insulating material, a semiconductor or an antiferromagnetic material against the magnetic layers, and the magnetoresistance effect element has terminals formed at least on the opposite magnetic layers, respectively, so that a current flows in the intermediate layer. The film surfaces of all the magnetic layers constituting the magnetoresistance effect element are opposed substantially at right angles to the recording surface of a magnetic recording medium. Therefore, the area of the magnetic layers facing the recording surface of the magnetic recording medium can be extremely reduced, and thus the magnetic field from a very narrow region of the high-density recorded magnetic recording medium can be detected by the current which has a tunneling characteristic and passes through the intermediate layer.

7 Claims, 17 Drawing Sheets

MAGNETIC APPARATUS WITH PERPENDICULAR RECORDING MEDIUM AND HEAD HAVING MULTILAYERED REPRODUCING ELEMENT USING TUNNELING EFFECT

This is a continuation application of U.S. Ser. No. 11/371,244, filed Mar. 9, 2006, now U.S. Pat. No. 7,159,303; which is a continuation of U.S. Ser. No. 10/700,500, filed Nov. 5, 2003, now U.S. Pat. No. 7,054,120; which is a continuation of 10/270,120, filed Oct. 15, 2002, now U.S. Pat. No. 6,687,099; which is a continuation of 09/931,897, filed Aug. 20, 2001, now U.S. Pat. No. 6,483,677; which is a continuation of 09/468,309, filed Dec. 21, 1999, now U.S. Pat. No. 6,278,593; which is a continuation application of 08/626,333, filed Apr. 2, 1996, now U.S. Pat. No. 6,011,674; which is a continuation of 08/328,090, filed Oct. 24, 1994, now U.S. Pat. No. 5,726,837; which is a continuation of 07/710,775, filed Jun. 5, 1991, now U.S. Pat. No. 5,390,061.

BACKGROUND OF THE INVENTION

This invention relates to magnetoresistance effect elements using a multilayered magnetic thin film with high magnetoresistance effect, and particularly to magnetoresistance effect elements, magnetic heads and magnetic storage apparatus for achieving high-density recording on a magnetic recording medium on which narrow tracks are formed.

An investigation is now being made of magnetic heads using the magnetoresistance effect for high density-magnetic recording. At present, an alloy film of Ni-20 at % Fe is used for the magnetoresistance effect material. However, a magnetoresistance effect element using the Ni-20 at % Fe alloy film often causes noise such as Barkhausen noise, and thus other magnetoresistance effect materials are also under investigation.

On the other hand, recently Suezawa, et al. have reported a magnetoresistance effect film which utilizes the ferromagnetic spin-dependent tunneling phenomenon and which detects magnetic flux from the electrical resistance change of a multilayered film having a pair of magnetic layers divided by an insulating layer, as is disclose in Proceedings of the International Symposium on Physics of Magnetic Materials, Apr. 8-11, 1987, pp. 303-306. This report has introduced a multilayered structure of a Ni/NiO/Co junction and multilayered films of Al/Al$_2$O$_3$/Ni, Co—Al/Al$_2$O$_3$/Ni exhibiting the ferromagnetic spin-dependent tunneling effect. However, in either case, the junction area between the pair of magnetic layers is as wide as about 1 mm$^2$, and the relative resistivity change, $\Delta\rho/\rho$ is as small as about 1% at room temperature. In addition, since the element structure shown in this example is not capable of sensing a small magnetic flux change, it is impossible to precisely detect the change of magnetic flux leaking from a magnetic recording medium recorded at a high density.

In the prior art, a Ni/NiO/Co multilayer, for example, has an Ni layer and a Co layer of a rectangular shape made perpendicular to each other to allow all current to pass the NiO layer to effectively detect the resistance change due to the ferromagnetic spin-dependent tunneling effect. However, when used for a magnetic head, the intersection of the ferromagnetic Ni layer and Co layer will be insufficient to precisely detect the magnetic field in a narrow region because the longitudinal direction of either magnetic layer is parallel to the surface of the magnetic recording medium. In other words, the magnetic flux change associated with the signal recorded in a narrow track cannot be detected with a high sensitivity.

Moreover, the ferromagnetic spin-dependent tunneling effect of an Fe/C/Fe multilayer has been reported by J. C. Slonczewski in Phys. Rev. Vol. B39, pp. 6995, 1989, "Conductance and Exchange Coupling of Two Ferromagnets Separated by a Tunneling Barrier".

In the application of the ferromagnetic tunneling film to the magnetic heads, the ferromagnetic tunneling film is required not to deteriorate in its characteristics in the course of the magnetic head producing process. The magnetic head producing process often includes a heating process. However, when the Fe/C/Fe multilayer film is heated to 300° C. or above, carbon C is diffused into the Fe layer, thus deteriorating the characteristics. Also, when the intermediate layer is made of an oxide such as NiO or Al$_2$O$_3$, the interface energy increases in the interface between the magnetic layers and the intermediate layer. The increase of the interface energy will act to decrease the number of atoms in the interface, thus causing defects such as vacancies in the intermediate layer and magnetic layer, so that the soft magnetic characteristics may be deteriorated as described by Nakatani, et al. in J. Appl. Phys., Vol. 66, pp. 4338, 1989, "Changes in Soft Magnetic Properties of Fe Multilayered Films due to Lattice Mismatches between Fe and Intermediate Layers".

Moreover, an Fe/Cr multilayered film has recently been reported, of which the relative resistivity change is about 50% as described in Physical Review Letters, Vol. 61, No. 21, pp. 2472 to 2475, 1988.

In the magnetoresistance effect element having such a multilayer structure as the Fe/Cr multilayered film, the electrical resistance is changed by the magnetic field when electrons are moved from a magnetic layer to another magnetic layer, or passed through a non-magnetic intermediate layer. At this time, the current is flowed in the film-thickness direction. However, the film thickness of the magnetic film is several hundreds of nm or below and the element resistance is low. Thus, the rate of resistance change is high, but the amount of resistance change is small. When this film is applied to an actual magnetic sensor or magnetic head, the output is small.

Also, in the magnetic disk apparatus, magnetic heads are used for writing and reading information on and from a magnetic recording medium, and in this case the electromagnetic induction-type ring head, for example, is widely used for the magnetic head for writing and reading. In a rigid-type magnetic disk apparatus for a computer, an induction current is flowed in the magnetic head which is floated with a very small gap from the surface of a disk-like magnetic recording medium rotating at a high speed, so that the magnetic field generated at the tip of the magnetic head can enable recording on the magnetic recording medium. As the recording density is improved so that the recorded bits are small, it has been demanded to use a magnetic head having a high writing and reading efficiency. In the prior art, the same ring head has been used for writing and reading, but no dual elements are used for an inductive-write and magnetoresistant-read dual-element magnetic head for improving their functional efficiency. An example of this dual-element magnetic head is disclosed in Japanese Patent laid-open Gazette No. JP-A-51-44917. For the dual-element magnetic head, it is desired to use elements having a particularly high-sensitivity reading function, in which case the magnetic detecting element using the magnetoresistance effect (Japanese Patent Publication No. JP-B-53-17404) and the magnetic detecting element using the magnetosensitive transistor (Japanese Patent Laid-open Gazette No. JP-A-57-177573) are proposed. However, these elements do not have enough magnetic detection sensitivity for high-density magnetic recording over 100 Mb/in$^2$.

SUMMARY OF THE INVENTION

Accordingly, it is an object of the invention to provide a magnetoresistance effect element capable of sensing a very small change of magnetic flux from a narrow region of a magnetic recording medium with high sensitivity and with high resolution.

It is another object of the invention to provide a magnetoresistance effect element having a high resistance to heat.

It is still another object of the invention to provide a magnetoresistance effect element of which the resistance can be greatly changed.

It is a further object of the invention to provide a magnetic head capable of detecting magnetic flux with high sensitivity and of being easy to produce, or having a simple construction.

It is still a further object of the invention to provide a magnetic storage apparatus capable of precisely writing and reading a high-density magnetic recording.

The inventors have studied the shape of the magnetoresistance effect element formed of a multilayered magnetoresistance effect film which has magnetic layers and an intermediate layer of an insulating material such as $Al_2O_3$, $SiO_2$, NiO or BN, a semiconductor such as Si, Ge or GaAs, or an antiferromagnetic material such as Cr, inserted between the magnetic layers, and have found that when the element is so constructed and shaped that all the current flowing in the magnetoresistance effect film is sure to be passed through the intermediate layers and that electrodes of nonmagnetic metal (conductor) are connected at least to part of the magnetoresistance effect film, the magnetoresistance effect element can detect the magnetic field from a narrow region with high sensitivity.

The first feature of this invention is that, since at least part of the multilayered magnetoresistance effect film is formed on a conductor of nonmagnetic metal and the film surfaces of all the magnetic layers of the magnetoresistance effect film are disposed substantially at right angles to the surface of a magnetic recording medium or the end surface of the multilayered magnetoresistance effect film is opposed to the magnetic recording medium surface, the area of the magnetic layers of the end surface portion of the magnetoresistance effect film can be extremely reduced, and thus a very small change of the magnetic flux leaking from a high-density recorded magnetic recording medium on which narrow tracks are formed can be detected with high sensitivity and with high resolution.

The magnetoresistance effect element structure according to this invention can be suitably formed of either one of the following magnetoresistance effect films (1) and (2):

(1) A multilayered film having magnetic layers and an intermediate layer of an insulating material such as $Al_2O_3$, $SiO_2$, NiO or BN, a semiconductor such as Si, Ge or GaAs, or other materials, inserted between the magnetic layers; for example, a ferromagnetic thin film, using a ferromagnetic spin-dependent tunneling effect, such as Ni/NiO/Co, Fe/Ge/Co, Al/Al$_2$O$_3$/Ni, Co—Al/Al$_2$O$_3$/Ni, Fe—C/SiO$_2$/Fe—Ru, Fe—C/Al$_2$O$_3$/Co—Ni, Fe—C/Al$_2$O$_3$/Fe—Ru and so on.

(2) A multilayered film having magnetic layers and an intermediate layer of an anti-ferromagnetic material such as Cr inserted between the magnetic layers; for example, a magnetic thin film using antiferromagnetic intermediate layers such as Fe/Cr.

Moreover, in the magnetoresistance effect element of this invention, in order for a very small change of magnetic flux to be detected with high sensitivity and with high resolution to produce a stable reproduced output, the following specific technical means can be employed:

(1) The coercive force of one of a pair of magnetic layers constituting a multilayered magnetoresistance effect film is reduced, so that the difference between the coercive force and that of the other magnetic layer can be increased.

(2) The easy axis directions of a pair of magnetic layers constituting a multilayered magnetoresistance effect film are made perpendicular to each other.

(3) Of a pair of magnetic layers constituting a multilayered magnetoresistance effect film, the angular magnetic anisotropy dispersion $\alpha_{90}$ of at least one magnetic layer is selected to be 10° or below.

(4) Of a pair of magnetic layers constituting a multilayered magnetoresistance effect film, at least one magnetic layer is made to be a single magnetic domain.

(5) A lamination comprised of a pair of magnetic layers and an insulating layer constituting a multilayered magnetoresistance effect film is held between layers of high-permeability magnetic materials.

As described above, since the element is so constructed and shaped that the current flowing in the multilayered magnetoresistance effect film is sure to be passed through the intermediate layer constituting the magnetoresistance effect film, and since for example at least a part of the magnetoresistance effect film is formed on a conductor of nonmagnetic metal, the magnetic field from a narrow region can be detected. In other words, when at least a part of the magnetoresistance effect film is formed on an electrode conductor of nonmagnetic metal, the film surfaces of all the magnetic layers constituting the magnetoresistance effect film can be opposed substantially at right angles to the magnetic recording medium surface. Thus, since the area of the magnetic layers of the end surface portion of the magnetoresistance effect film facing the magnetic recording medium can be extremely reduced, the magnetic field from a narrow region can be detected with a high sensitivity. In addition, either one of the multilayered magnetoresistance effect films, or (1) the magnetic thin film using the ferromagnetic spin-dependent tunneling effect and (2) the magnetic thin film using the antiferromagnetic intermediate layers, can be applied to the element structure of this invention.

Moreover, in order for, for example, one of a pair of magnetic layers constituting the multilayered magnetoresistance effect film to be changed in its magnetization direction by the magnetic field leaking from the medium, the coercive force is set to about the leaked magnetic field strength. Also, in order for the other magnetic layer not to be changed in its magnetization direction even if the leaked magnetic field from the medium is applied thereto, the coercive force is set to a sufficiently high value.

If the coercive forces of the pair of magnetic layers are set as above, it is possible to obtain an output that is higher than in the conventional inductive-type thin-film head or magnetoresistance effect head.

Moreover, the magnetic layer which is changed in its magnetization direction by the magnetic field leaking from the medium is required to have a small angular magnetic anisotropy dispersion and a single magnetic domain in order that the magnetization rotation is caused at a time. If this condition is satisfied, the reading sensitivity and stability can be improved.

Moreover, the total film thickness of the multilayered magnetoresistance effect film comprised of a pair of magnetic layers and an insulating layer is reduced to be smaller than the shortest recorded bit length written on the medium, and the multilayered magnetoresistance effect film is held between a pair of high-permeability films, thereby further improving the reading resolution.

In addition, since the junction area between a pair of magnetic layers constituting the multilayered magnetoresistance effect film is reduced, the probability of the occurrence of defects (pinholes) in the insulating layer can be reduced, so that the reproduction sensitivity can be further improved.

The second feature of the invention is that even if the coercive forces of the two magnetic layers of the ferromagnetic spin-dependent tunneling effect film constituting the magnetoresistance effect element are not greatly different (e.g. even if the materials of the two layers are the same), application of a bias magnetic field from an antiferromagnetic material to one magnetic layer will enable the magnetic field for changing the magnetization direction of the layer to change, so that the magnetization directions of both layers are antiparallel in a certain range of magnetic field, but are parallel in another range of magnetic field, thus the element exhibiting the magnetoresistance effect.

Moreover, since at least a part of the ferromagnetic spin-dependent tunneling effect film is formed on nonmagnetic metal, the area of the magnetic layers facing the magnetic recording medium can be decreased, so that the magnetic field from a narrow region can be detected.

As described above, even if the coercive forces of the two magnetic layers of the ferromagnetic tunneling effect film are not greatly different (e.g. if the materials of the two layers are the same), application of a bias magnetic field from the antiferromagnetic material to one magnetic layer will enable the magnetic field for changing the magnetization directions of both layers to change. Thus, the magnetization directions of both layers are antiparallel in a certain range of magnetic field, but are parallel in another range of magnetic field, thus the element exhibiting the magnetoresistance effect.

Moreover, since at least a part of the ferromagnetic tunneling effect film is formed on nonmagnetic metal, the area of the magnetic layers facing the magnetic recording medium can be decreased, so that the magnetic field from a narrow region can be detected.

The third feature of the invention is that, since after the study on the multilayered film exhibiting the ferromagnetic spin-dependent tunneling effect, one or more materials for an intermediate layer are selected from a carbide, a boride, a nitride, a phosphide and a compound of group IIIb to Vb elements, the soft magnetic characteristics of the magnetic layers are not deteriorated and the characteristics of the ferromagnetic spin-dependent tunneling element are not changed even when the element is passed through the heating process for magnetic head production.

In other words, when an oxide intermediate layer of NiO or $Al_2O_3$ is used, the interface energy is increased in the interface between the magnetic layers and intermediate layer. When the interface energy is high, the number of atoms in the interface tends to decrease, and defects may occur, such as vacancies from which atoms are ejected, so that the soft magnetic characteristics may be deteriorated as described by Nakatani, et al. in J. Appl. Phys., Vol. 66, pp. 4338, 1989, "Changes in Soft Magnetic Properties of Fe Multilayered Films due to Lattice Mismatches between Fe and Intermediate Layers". On the other hand, the intermediate layer of a carbide, a boride, a nitride, a phosphide or a compound of group IIIb to Vb elements has a low interface energy between the magnetic layers. Therefore, the number of atoms in the interface may be large, and thus no defect occurs in the magnetic layers. Moreover, the compound intermediate layer has a high melting point and thus if the element is passed through the heating process for magnetic head production, the elements of the intermediate layer are not diffused into the magnetic layers, so that the ferromagnetic tunneling effect element is not deteriorated. Also, since the intermediate layer is used to form the tunneling junction, it is necessary for it to be made of an insulating material or to have an electrical resistance higher than that of the semiconductor.

In summary, as described above, the intermediate layer of carbide, a boride, a nitride, a phosphide or a compound of group IIIb to Vb elements has a low interface energy between the magnetic layers. Therefore, no defect occurs in the magnetic layers. Moreover, the compound intermediate layer has a high melting point and thus if the element is passed through the heating process for the magnetic head production, the elements of the intermediate layer are not diffused into the magnetic layers, so that the ferromagnetic tunneling effect element is not deteriorated.

The fourth feature of the invention is that, since after the study on the element using the Fe/Cr multilayered film and the element having the magnetoresistance effect due to the multilayered structure such as the ferromagnetic tunneling element, it has been found that the resistances of these elements are low so that a large amount of resistance change cannot be obtained even when the relative resistivity change is high, or that in the element having the Fe/Cr multilayered films and the element having the magnetoresistance effect due to the multilayered structure such as the ferromagnetic tunneling element, the electrical resistance of the whole element can be increased by series connection of a plurality of magnetoresistance effect elements, and that the element is so constructed that electrons are passed a plurality of times through the nonmagnetic layer located at the same distance from the base.

As described above, in the element having the Fe/Cr multilayered films and the element having the magnetoresistance effect due to the multilayered structure such as the ferromagnetic tunneling element, the electrical resistance of the whole element can be increased and a large amount of resistance change can be obtained by series connection of a plurality of magnetoresistance effect elements. Also, since the element is so constructed that electrons are passed a plurality of times through the nonmagnetic layer located at the same distance from the substrate, the electrical resistance of the whole element can be increased and a large amount of resistance change can be obtained without increasing the film thickness of the whole element. Moreover, according to this invention, since the film thickness of the whole element is not changed, the resolution relative to the magnetic field distribution in the wavelength direction is not reduced when the element is used in a magnetic head.

The fifth feature of the invention is that, as an element for detecting the magnetic flux leaking from the magnetic domain recorded on a magnetic recording medium, a plurality of ferromagnetic laminated elements connected in series through a very thin electrically insulating film, semiconductor film or semimetal film can be used in a magnetic head to detect the phenomenon that the tunneling current flowing through the element upon supplying current thereto is changed in accordance with the change of the magnetic field.

BRIEF DESCRIPTION OF THE DRAWINGS

FIGS. 20A, 20B, 20C, 20D and 20E are perspective views showing the manufacturing processes of a magnetoresistance effect element using the Fe/Cr multilayered films in an eighth embodiment of the invention.

DESCRIPTION OF THE PREFERRED EMBODIMENTS

Embodiments of the invention will be described with reference to the drawings.

Figure 1:
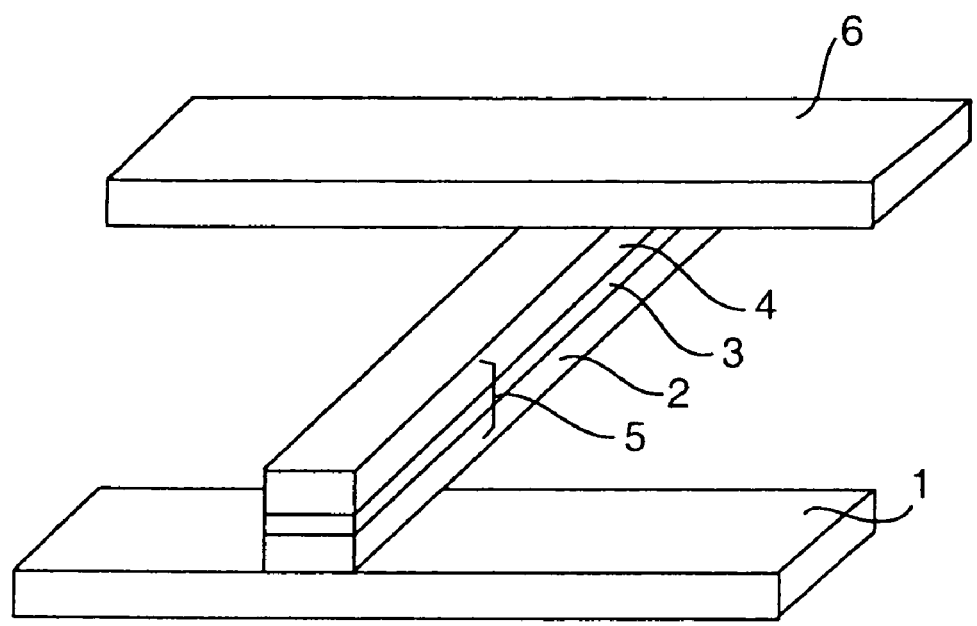
FIG. 1 is a perspective view of the structure of a magnetoresistance effect element of a first embodiment of the invention.

FIG. 1 is the structure of one embodiment of a magnetoresistance effect element of the invention.

The magnetoresistance effect film using the magnetoresistance effect element and the Cu electrode were produced by an ion beam sputtering apparatus under the following conditions:

| | |
|---|---|
| Ion gas | Ar |
| Ar gas pressure within apparatus | $2.5 \times 10^{-2}$ Pa |
| Acceleration voltage of ion gun for evaporation | 400 V |
| Ion current of ion gun for evaporation | 60 mA |
| Distance between target and substrates | 127 mm |

The magnetoresistance effect film and Cu electrode were shaped by ion milling, and Corning-7059 glass was used for the substrate.

The process for producing the magnetoresistance effect element shown in FIG. 1 will be described below. First, a Cu film is formed on a glass substrate by ion beam sputtering and worked to be a Cu electrode 1 of a rectangular shape of 8-µm width, 2-mm length by ion milling. Level differences, or steps, caused by the working are flattened with a resin. Then, a 100-nm thick Fe-1.3 at % Ru allow layer 2, a 10-nm thick SiO$_2$ layer 3 and a 100-nm thick Fe-1.00 at % C alloy layer 4 are deposited in turn by ion beam sputtering. These layers are worked to be a rectangular of 5-µm width, 20-µm length by the ion milling, thus producing a magnetoresistance effect film 5. Level differences, or steps, caused by this working are flattened with a resin. Moreover, a Cu thin film is formed on this film by ion sputtering and worked to be a rectangular Cu electrode 6 of 8-µm width, 2-µm length. Current is flowed between the Cu electrode 1 and the Cu electrode 6, and the change of the voltage thereacross is measured so that the change of the electrical resistance is detected. In this case, the current particularly flows through the SiO$_2$ layer 3.

Figure 2:
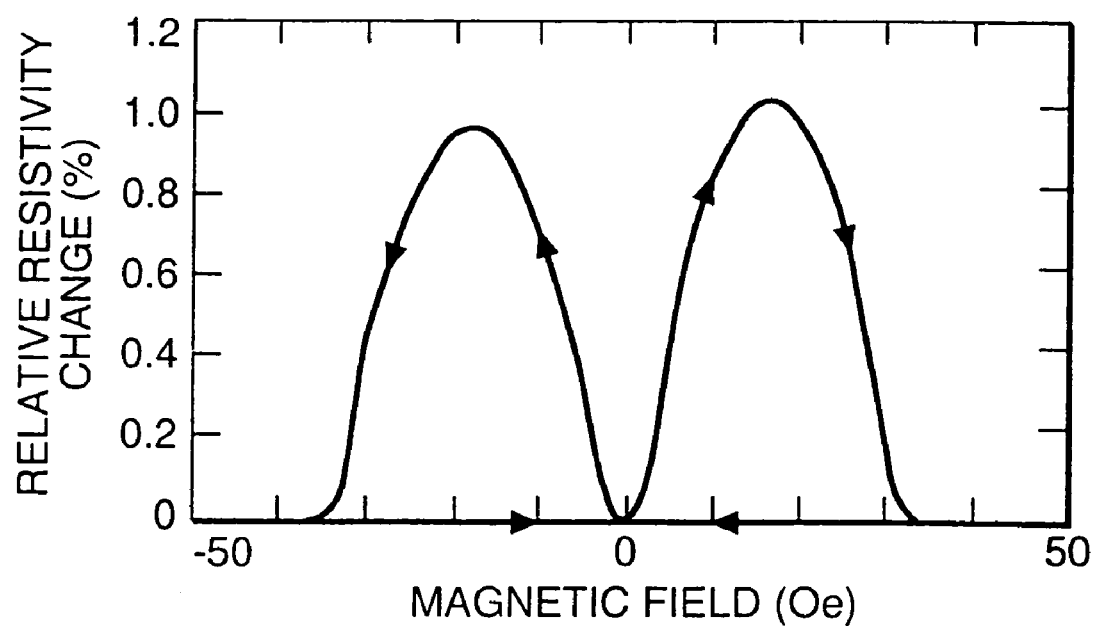
FIG. 2 is a graph showing the relation between the applied magnetic field and the relative resistivity change of the magnetoresistance effect element.

When a magnetic field is applied to the magnetoresistance effect film 5 in the longitudinal direction by use of a Helmholtz coil and the change of the electrical resistance examined, FIG. 2 shows the relation between the magnetic field and the electrical resistance. As illustrated, the electrical resistance of the element changes with the magnitude of the magnetic field. The maximum relative resistivity change is about 1%. This value is substantially the same as that of the Ni/NiO/Co multilayered film described in one of the above citations, but the magnetic field intensity at which the electrical resistance is the maximum, in the magnetoresistance effect element of the invention, is lower than in the prior art. Therefore, the element according to this invention is very advantageous when used for the magnetic head.

The cause of this resistance change will be considered as follows. By the measurement of the magnetization curves, it was found that the coercive force of the Fe-1.3 at % Ru alloy layer 2 was 25 Oe and that the coercive force of the Fe-1.0 at % C alloy layer 4 was 8 Oe. When the magnetic field strength is changed, the direction of the magnetization of the Fe-1.0 at % C alloy layer 4 changes, but that of the Fe-1.3 at % Ru alloy layer 2 does not change. However, when a magnetic field of 25 Oe is applied, the direction of the magnetization of the Fe-1.3 at % Ru alloy layer 2 is changed. Thus, under the application of a field of ±8 to 25 Oe, the magnetization directions of the Fe-1.0 at % C alloy layer 4 and Fe-1.3 at % Ru alloy layer 2 are antiparallel, when the field strength is out of the above range, the magnetization directions are parallel. Accordingly, since the tunneling current flowing in the $SiO_2$ layer 3, causes the conductance to become higher when the magnetization directions of the magnetic layers are parallel than when the magnetization directions are antiparallel, the electrical resistance of the element changes with the magnitude of the magnetic field.

Figure 12:
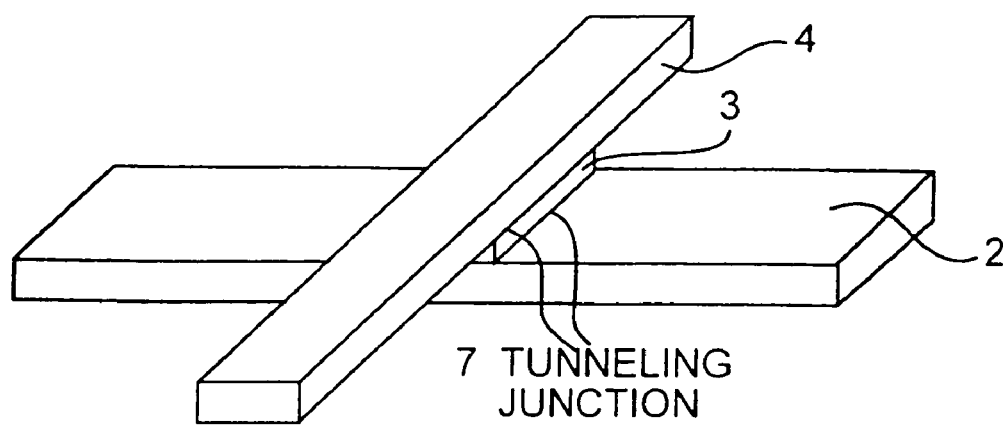
FIGS. 12 and 13 are perspective views of the structures of the conventional magnetoresistance effect elements.

To further illustrate the present embodiment, a ferromagnetic tunneling element, having the same shape as in the prior art shown in FIG. 12, is formed of the Fe-1.3 at % Ru alloy layer 2 of 5-μm width, 100-nm thickness, the $SiO_2$ layer 3 of 10-nm thickness, and the Fe-1.0 at % C alloy layer 4 of 5-μm width, 100-nm thickness. The Fe-1.3 at % Ru alloy layer 2 and the Fe-1.0 at % C alloy layer 4 are perpendicular to each other.

The magnetoresistance effect element of the same shape as in the prior art has the same magnetic layers as the magnetoresistance effect element (FIG. 1) of the present invention mentioned above, and thus exhibits substantially the same resistance change with the magnetic field strength as does the element shown in FIG. 1.

When the magnetic field from the magnetic recording medium is detected by these elements, the magnetoresistance effect element of the invention (FIG. 1) is capable of reading a track of 5-μm width by facing the end of the rectangular magnetoresistance effect film 5 of 5-μm width and 20-μm length to the magnetic recording medium. However, in the magnetoresistance effect element of the same shape as in the prior art (FIG. 12), the tunneling junction 7, which is greatly concerned with the magnetoresistance effect, is formed at the center between the Fe-1.0 at % C alloy layer 4 and the Fe-1.3 at % Ru alloy layer 2, and thus cannot be faced to the magnetic recording medium.

Figure 13:
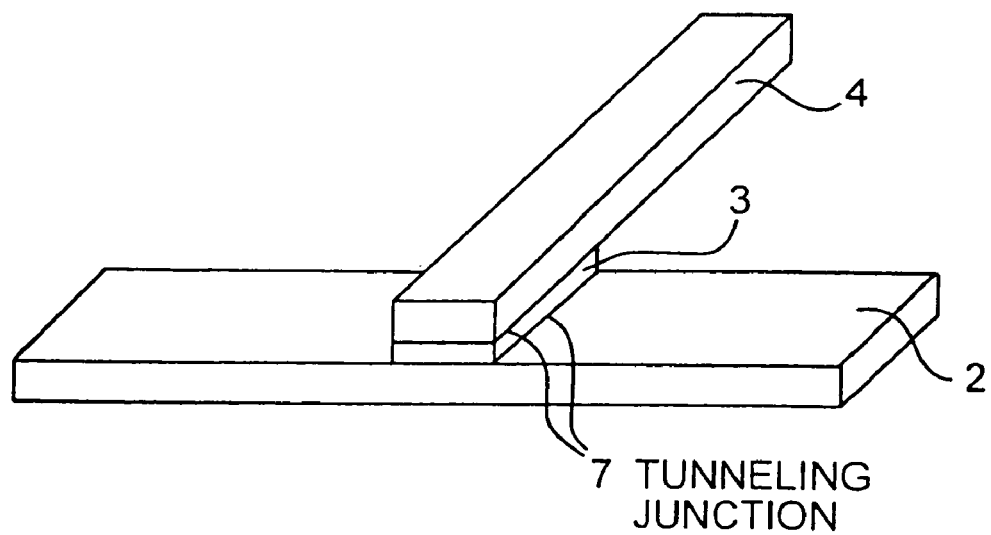

Thus, for the description of this embodiment, a magnetoresistance effect element of the conventional structure shown in FIG. 13 may be produced. This element is formed of the Fe-1.3 at % Ru alloy layer 2 of 5-μm width, 100-nm thickness, the $SiO_2$ layer 3 of 10-nm thickness, and the Fe-1.0 at % C alloy layer 4 of 5-μm width, 100-nm thickness. The Fe-1.0 at % C alloy layer 43 is cut off at the tunneling junction 7, and thus the tunneling junction 7 can be faced to the magnetic recording medium. However, in the structure of FIG. 13, the longitudinal direction portion of the Fe-1.3 at % Ru alloy layer 2 is faced to the magnetic recording medium and thus affected by the magnetic field leaked from the magnetic recording medium. Therefore, even if the width of the Fe-1.0 at % C alloy layer 4 is selected to be 5 μm, the effective track width is much greater than 5 μm.

According to the structure of the element of the invention, as described above, at least part of the magnetoresistance effect film is formed on a nonmagnetic metal conductor, and the magnetoresistance effect films are overlapped in a straight line so that the current can completely flow through the intermediate layer. Thus, the longitudinal (film surface) directions of all the magnetic layers of the magnetoresistance effect film are made substantially perpendicular to the magnetic recording medium surface, making it possible to extremely reduce the area of the magnetic layer at the end of the magnetoresistance effect film opposing the magnetic recording medium, and to detect the magnetic field leaked from narrow regions with high sensitivity.

While in this embodiment the Fe-1.3 at % Ru alloy layer 2 and the Fe-1.0 at % C alloy layer 4 are used as the magnetic layers, and the $SiO_2$ layer 3 is used as the intermediate layer, other magnetic materials and insulating materials may be used for the magnetic layers and intermediate layer, in which case the same effect can of course be achieved.

Figure 3:
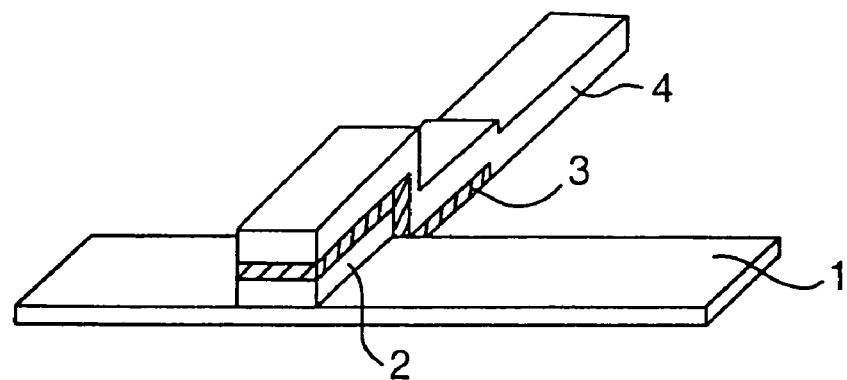
FIGS. 3 and 4 are perspective views of the structure of a magnetoresistance effect element of a second embodiment of the invention.

FIG. 3 shows the structure of a second embodiment of a magnetoresistance effect element of the invention.

The magnetoresistance effect element having the structure shown in FIG. 3 will be described in the same way as in the first embodiment. The process for this magnetoresistance effect element will also be described below. First, the Fe-1.3 at % Ru alloy layer 2 of 5-μm width, 8-μm length and 100-nm thickness is formed on the rectangular Cu electrode 1 of 8-μm width and 2-mm length. Then, the $SiO_2$ layer 3 is deposited to cover all of the Fe-1.3 at % Ru alloy layer 2. Also, the Fe-1.0 at % C alloy layer 4 of 5-μm width, 100-nm thickness is formed to cover all of the $SiO_2$-layer 3. A current is flowed between the Cu electrode 1 and the Fe-1.0 at % C alloy layer 4 and the voltage thereacross is measured.

In the magnetoresistance effect element shown in FIG. 3, all of the current is flowed in the intermediate layer, and thus the magnetoresistance effect can be effectively utilized. Also, the magnetoresistance effect films can be overlapped in a straight line, and the longitudinal (film surface) direction of all the magnetic layers of the end surfaces of the magnetoresistance effect films can be made perpendicular to the magnetic recording medium surface. Thus, the area of the magnetic layers at the end surfaces of the magnetoresistance effect films opposite to the magnetic recording medium can be extremely reduced so that the magnetic field from a narrow region can be detected with high sensitivity.

Figure 4:
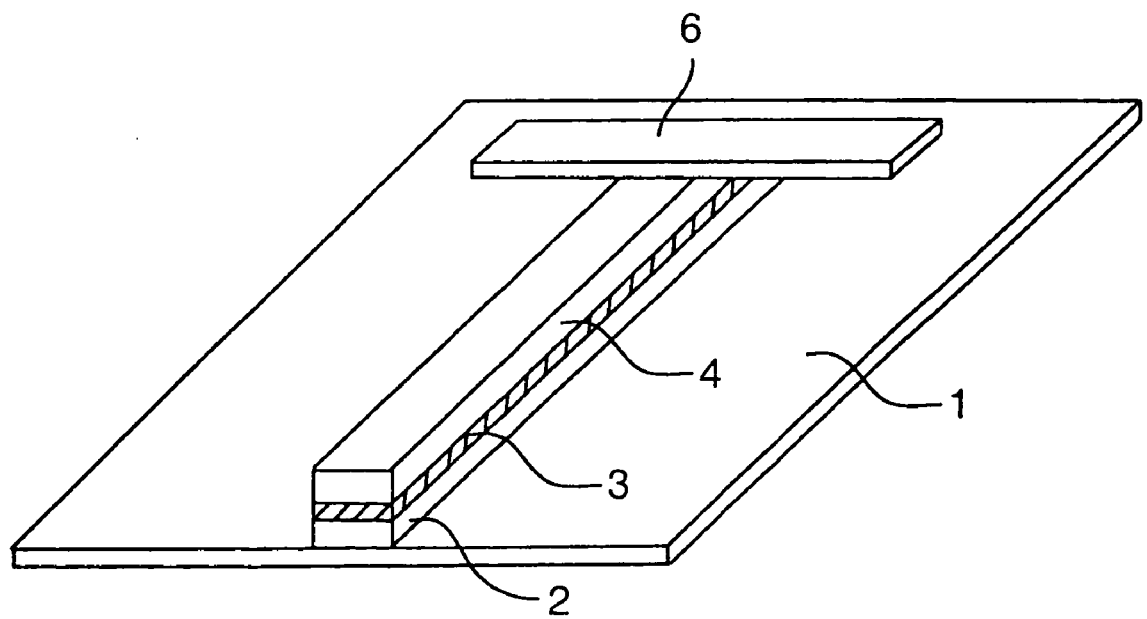

In addition, the construction of an element shown in FIG. 4 can be considered to have the same effect as the magnetoresistance effect element shown in FIG. 3. As illustrated, the Fe-1.3 at % Ru alloy layer 2, the $SiO_2$ layer 3, and the Fe-1.0 at % C alloy layer 4 are formed on the large-area Cu electrode 1. That is, the Fe-1.3 at % Ru alloy layer 2, the $SiO_2$ layer 3, and the Fe-1.0 at % C alloy layer 4 are formed on the large-area Cu electrode 1. The level differences, or steps, are flattened with a resin or the like, and the Cu electrode 6 is formed to be in contact with the Fe-1.0 at % alloy layer 4.

While in this embodiment the Fe-1.3 at % Ru alloy layer 2 and the Fe-1.0 at % C alloy layer 4 are used as the magnetic layers, and the $SiO_2$ layer 3 is used as the intermediate layer, the magnetic layers and intermediate layer may be made of other magnetic materials and insulating materials, respectively, in which case the same effect can be achieved.

Another embodiment of a magnetoresistance effect element of the invention will be described below. The magnetoresistance effect film 5 of the magnetoresistance effect element shown in FIG. 1 is formed of an Fe(3 nm)/Cr(1 nm) multilayered film (100 nm thick).

A magnetic field from a Helmholtz coil was applied to the magnetoresistance effect film 5 in the longitudinal direction, and the relative resistivity change was examined. The result was that, in the element of this embodiment, the resistivity of the element changes with the magnitude of the magnetic field and the maximum relative resistivity change is about 10%.

A description will be made of the process for producing the reading magnetic heads using the magnetoresistance effect elements of the above embodiments, the measured relative resistivity change, and the reading sensitivity with which the recorded signal actually written on the magnetic recording medium is read, as compared with those of the conventional magnetoresistance effect-type (MR) head and induction-type thin-film head.

Figure 5A:
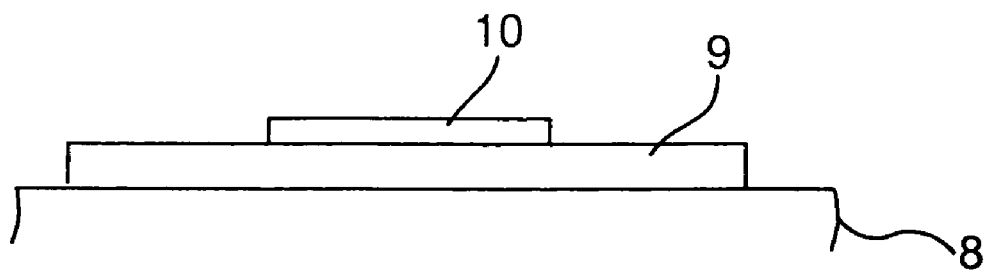
FIGS. 5A, 5B and 5C are diagrams showing manufacturing processes for a magnetoresistance effect element.
Figure 5B:
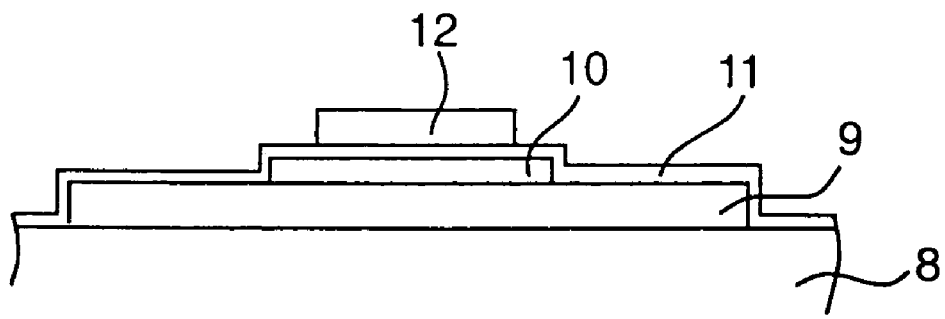
Figure 5C:
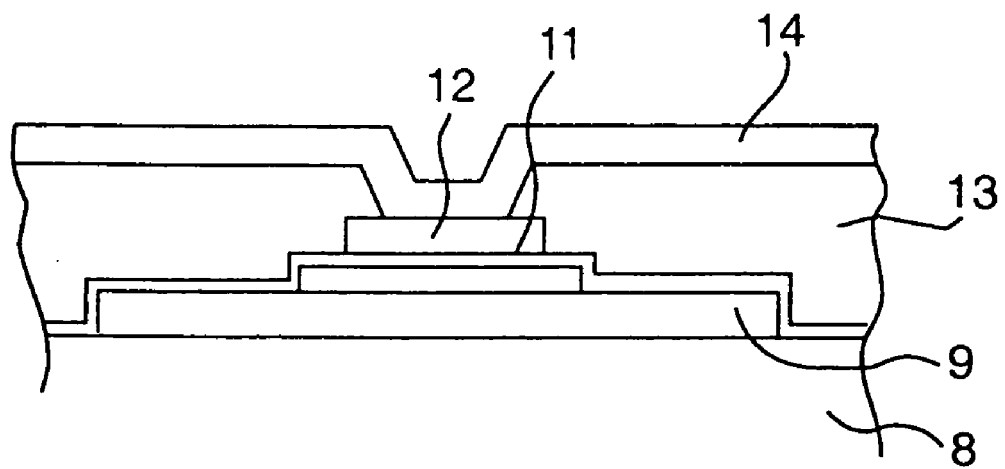

FIGS. 5A, 5B and 5C are useful for explaining the process for producing the head. First, the Cu layer for a lower electrode 9 is deposited on a substrate 8 by sputtering. Then, a Co—Ni-based magnetic layer of high coercive force Hc=2000 Oe is deposited thereon to a thickness of 0.1 μm by sputtering to form a lower magnetic pole 10. This lower magnetic pole 10, after being deposited, is patterned to be 3 μm wide and 3 μm long by the normal photoresist process. Thereafter, an insulating layer 11 of $Al_2O_3$ is deposited thereover to a thickness of 50 Å by the same sputtering method.

Then, a magnetic layer for an upper magnetic pole 12 is deposited by sputtering, which layer is made of an Fe-based alloy having a saturation magnetic flux density Bs=2.0 T, coercive force 0.3 Oe and angular magnetic anisotropy dispersion $\alpha_{90}$ 5° or below.

In the above embodiments, the upper magnetic pole 12 is made of an Fe—C alloy. This magnetic layer should have a single magnetic domain for stabilizing the reading characteristics. For this purpose, a BN intermediate layer is inserted in the magnetic layers.

The upper magnetic pole 12 is patterned to be 2 μm wide and long. After the patterning, a resist 13 is coated on the upper magnetic pole 12, and a through-hole is formed therein. Then, an upper electrode 14 through which a current is supplied to the upper magnetic pole 12 is formed, completing the process.

Figure 6:
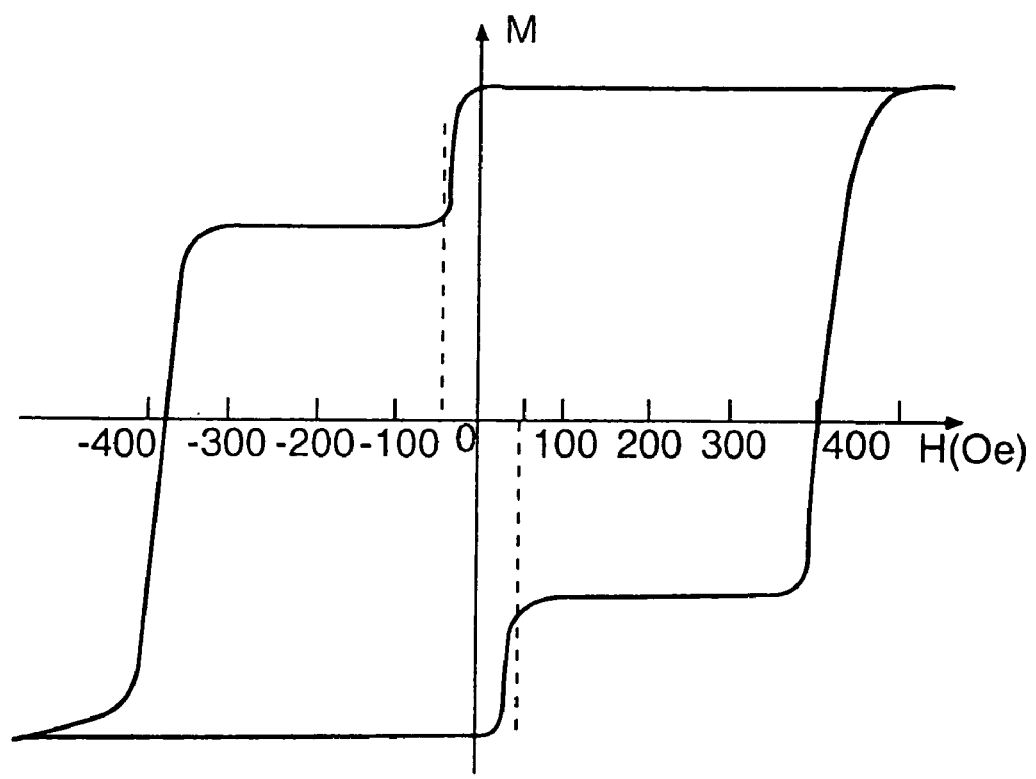
FIG. 6 is a graph showing the hysteresis characteristic of a magnetoresistance effect element produced by the processes shown in FIGS. 5A, 5B and 5C.

FIG. 6 shows the hysteresis characteristics of the device. From FIG. 6, it will be seen that the difference between the coercive forces of a pair of magnetic layers appears clearly. The coercive forces of the paired magnetic layers are 50 Oe and 400 Oe, respectively. Within the range from 50 Oe to 400 Oe, the amount of magnetization of the magnetic layers is almost not changed with the change of the external magnetic field, and the paired magnetic films are quite separately changed in magnetization as will be understood from FIG. 6. The difference between the coercive forces of the paired magnetic layers is set to a proper value depending on the coercive force and saturation magnetization of the medium to be used, so that the reading sensitivity to the external magnetic field can be increased.

Figure 7:
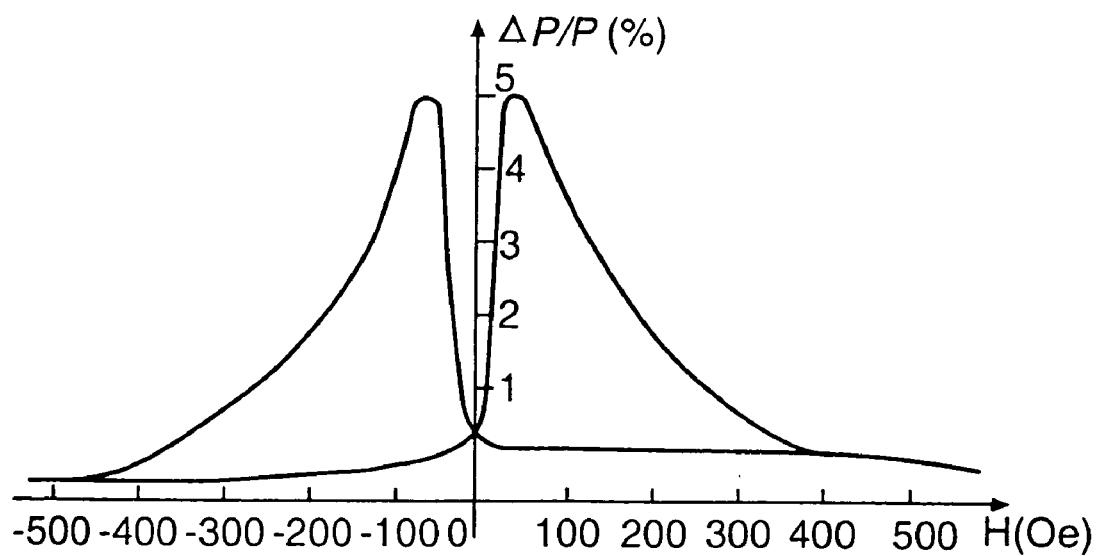
FIG. 7 is a graph showing the constant applied magnetic field vs. relative resistivity change of a magnetoresistance effect element produced by the processes shown in FIGS. 5A, 5B and 5C.

FIG. 7 shows the measured result of the relative resistivity change to a uniformly applied magnetic field. Although the measurement was made at room temperature, the relative resistivity change $\Delta\rho/\rho$ is as high as 5%. The easy axis direction between the pair of anisotropic magnetic layers was 90° and the external magnetic field was applied in the easy axis direction of the magnetic layer having the higher coercive force.

Figure 8:
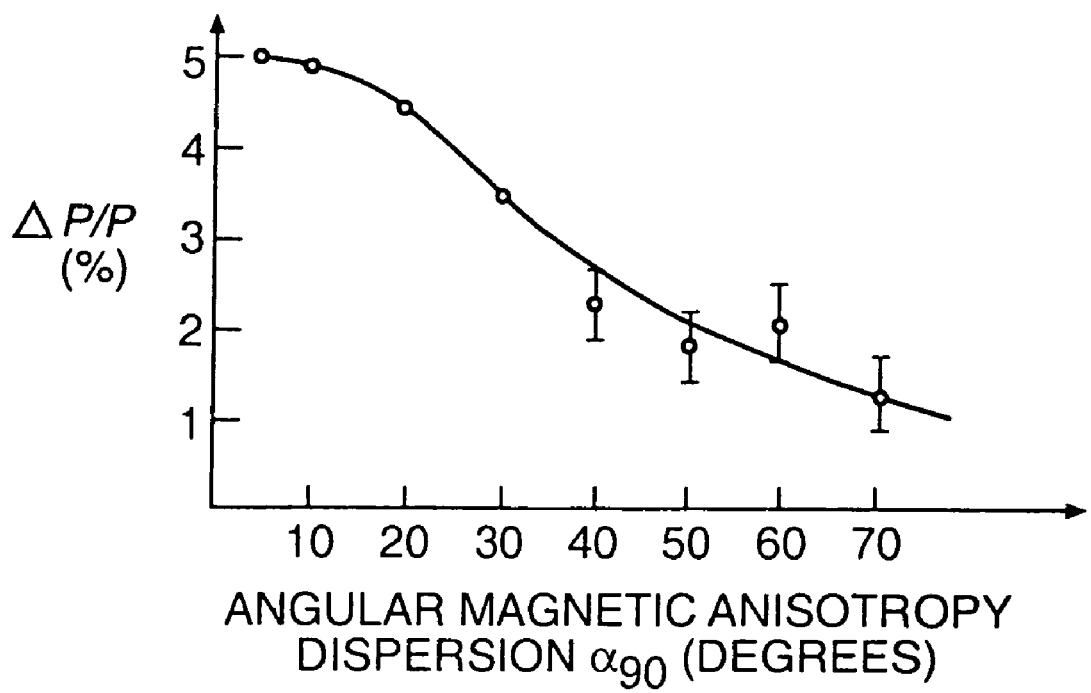
FIG. 8 is a graph showing the relation between the angular magnetic anisotropy dispersion $\alpha_{90}$ and the rate of resistance of a magnetoresistance effect element produced by the processes shown in FIGS. 5A, 5B and 5C.
Figure 9:
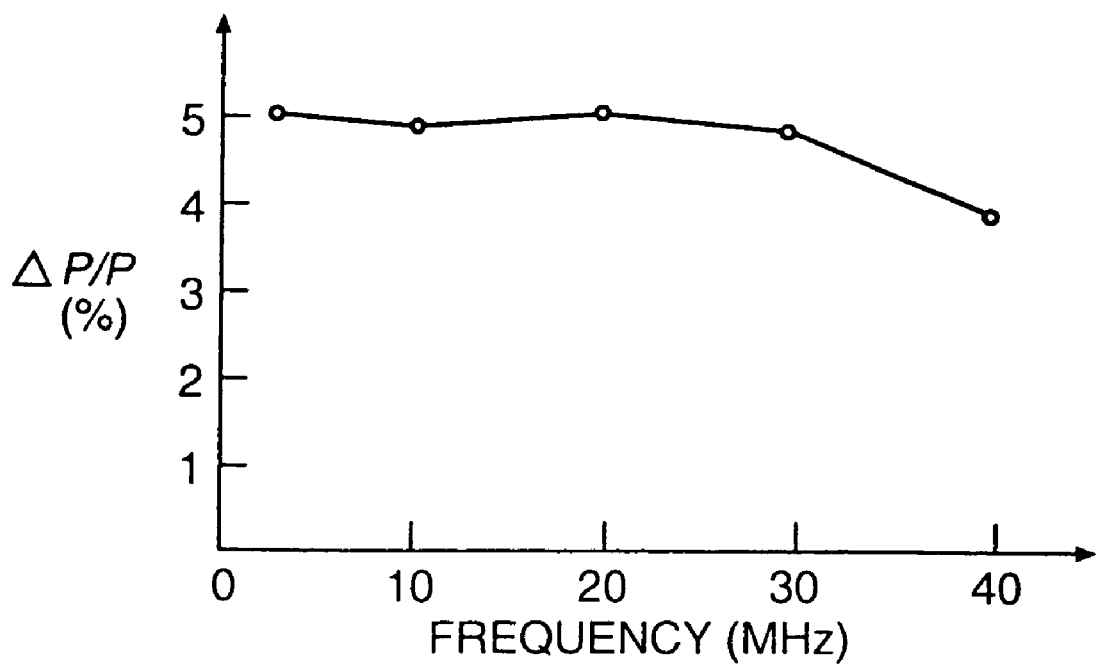
FIG. 9 is a graph showing the relation between the frequency and the relative resistivity change of a magnetoresistance effect element produced by the processes shown in FIGS. 5A, 5B and 5C.

FIG. 8 shows the measured result of the relative resistivity change with the gradual decrease of the angular magnetic anisotropy dispersion angle from 70°. From FIG. 8, it was confirmed that the better results can be obtained for smaller angular dispersions $\alpha_{90}$. However, under the present technique, the angular dispersion is limited to about 5 degrees at which the relative resistivity change $\Delta\rho/\rho$ is 5%. If the angular dispersion is limited to about 10 degrees, the relative resistivity change can be set to 4.8% or above. Thus, in this embodiment, the angular dispersion is set to within 5 to 10 degrees. Also, the sample was cut in one direction by mechanical abrasion, a normal thin film head was pressed onto the abraded surface of the sample, and the relative resistivity change in a high frequency region was measured. FIG. 9 shows the result. From FIG. 9, it was confirmed that the relative resistivity change is substantially flat up to 30 MHz.

Figure 10:
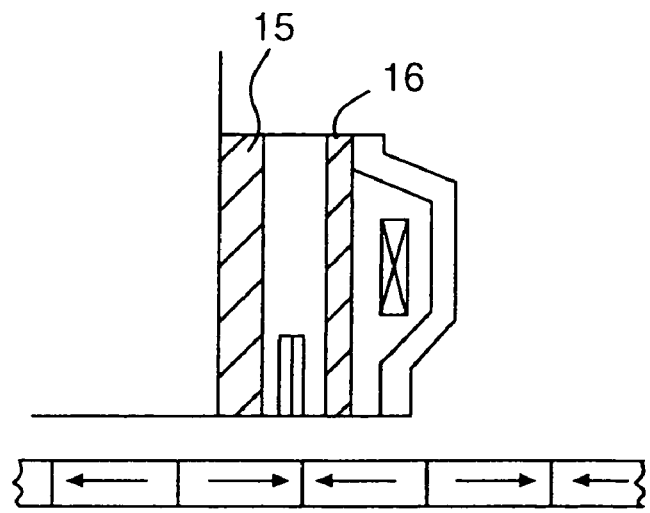
FIG. 10 is a cross-sectional diagram of the writing/reading dual-element magnetic head having a magnetoresistance effect element formed on the induction-type thin-film head.

In addition, the magnetoresistance effect elements according to the first and second embodiments were attached on inductive thin-film heads to form an inductive-write and magnetoresistant-read dual-element head, and the reading characteristics were measured. FIG. 10 shows the cross-sectional structure of the dual-element head. Here, in order to increase the resolution to the external magnetic field, shield layers 15, 16 are provided on both sides of the multilayered film which is formed of a pair of magnetic layers and a nonmagnetic intermediate layer, as shown in FIG. 10. The distance between the shield layers 15 and 16 is 0.3 μm.

Figure 11:
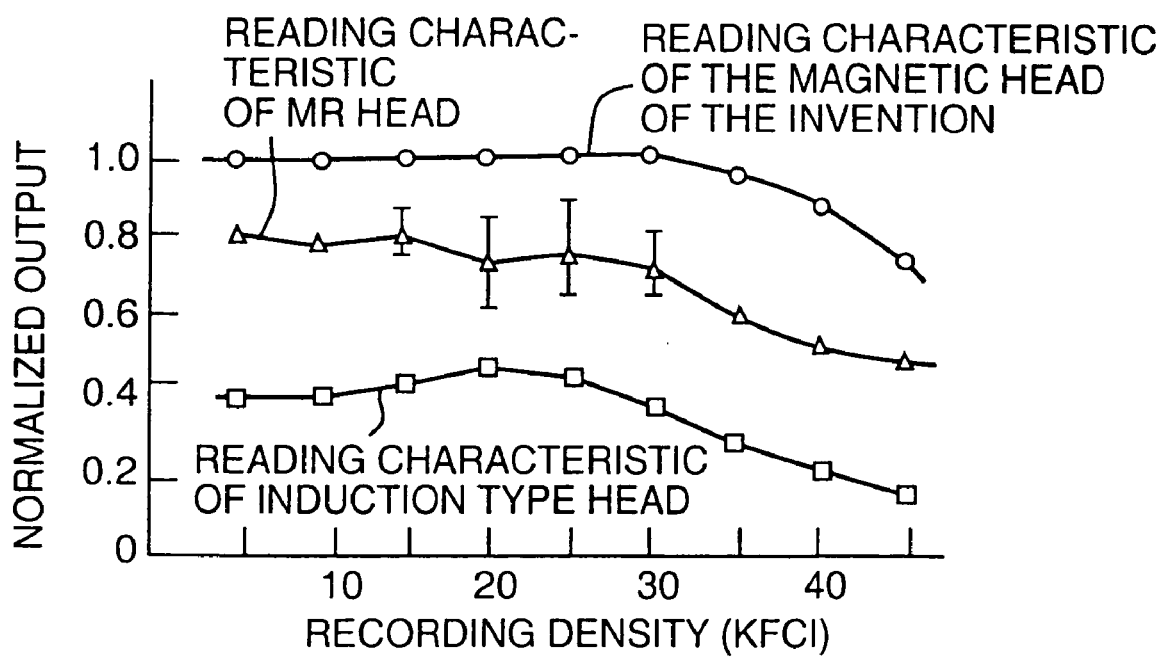
FIG. 11 is a graph showing the comparison of the reading characteristic of the magnetic head shown in FIG. 10 with the conventional induction-type thin-film head.

The reading characteristic of this magnetic head combined with a 500 Å sputtered medium having a coercive force of 2000 Oe was measured and compared with the induction-type thin-film head and the MR head. FIG. 11 shows the compared result of the reading sensitivity of each head, in which the abscissa is the recording density and the ordinate is the reading output per unit track width. In this measurement, the spacing was 0.15 μm. From the result, it was confirmed that the reading output of the magnetic head according to the invention is 2.5 times as large as that of the inductive head, and about 1.3 times as large as that of the MR head. Moreover, the variation of reading output as measured in the MR head was not observed at all.

Thus, according to the first feature of the invention, in the magnetoresistance effect element using a multilayered magnetoresistance effect film which is formed on magnetic layers and a semiconductor or antiferromagnetic intermediate layer inserted between the magnetic layers, all the current flowing in the magnetoresistance effect film is sure to pass through the intermediate layer, at least part of the magnetoresistance effect film is formed on a conductor made of a nonmagnetic metal, and the film surface directions of all the magnetic layers of the magnetoresistance effect film are made to be substantially perpendicular to the magnetic recording medium surface so that the magnetic field can be detected. Thus, the area of the magnetic layer of the end face of the magnetoresistance effect film opposite to the magnetic recording medium can be extremely reduced, and the magnetic field leaked from the narrow regions of the high-density magnetic recording medium having narrow tracks can be detected with high sensitivity.

Moreover, the magnetoresistance effect film having the multilayered structure may be either of:

(1) A magnetic thin film using the ferromagnetic spin-dependent tunneling effect, and (2) A magnetic thin film using the antiferromagnetic intermediate layer.

In addition, the reading magnetic head using the magnetoresistance effect element, even for a track width of, for example, 2 μm or below, can produce a stable output with a high S/N ratio, and thus it is extremely useful as the head of a magnetic disk apparatus which has a large storage capacity and requires high-speed transfer of data.

Figure 14A:
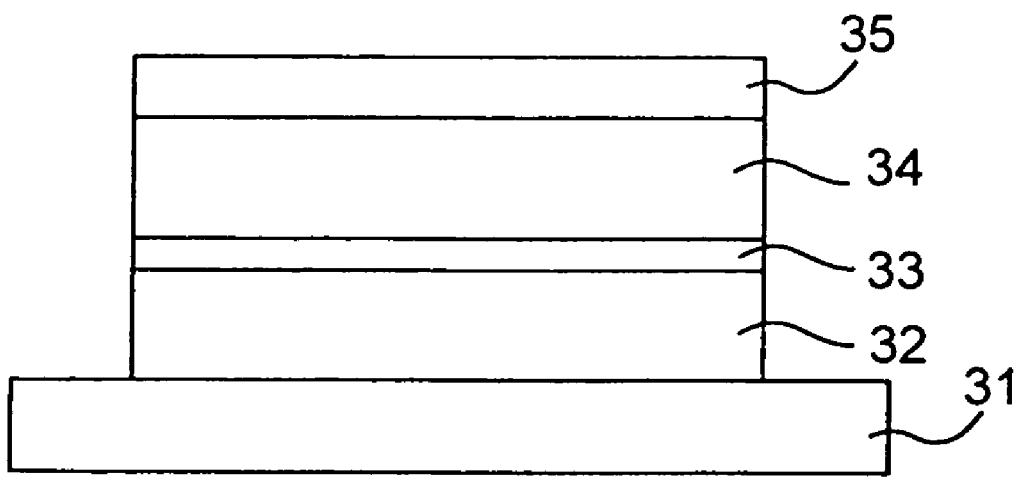
FIG. 14 is a side view of the structure of the ferromagnetic tunneling film of a magnetoresistance effect element of a third embodiment of the invention.
Figure 14B:
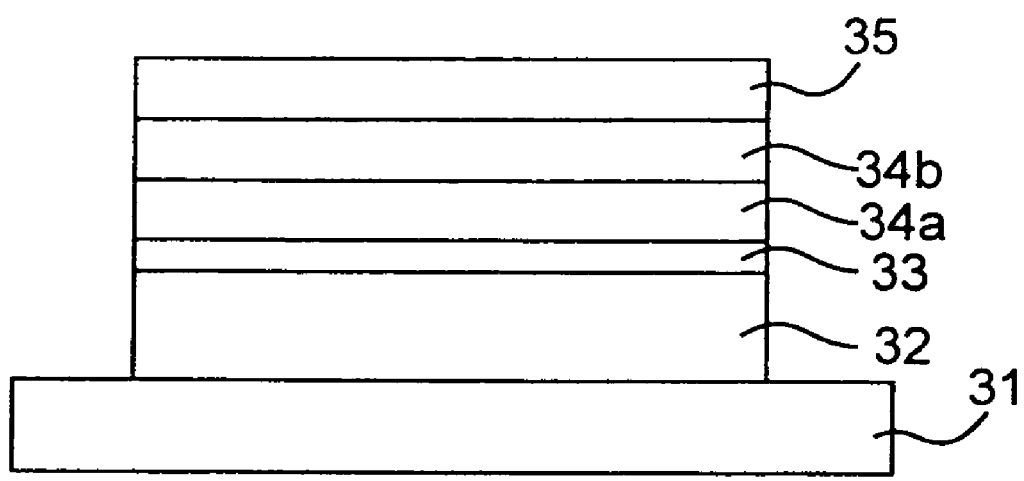

FIG. 14 shows the structure of a third embodiment of a magnetoresistance effect element of the invention.

The ferromagnetic spin-dependent tunneling effect film which constitutes the magnetoresistance effect element is formed by an ion beam sputtering apparatus under the following conditions:

| | |
|---|---|
| Ion gas | Ar |
| Ar gas pressure within the apparatus | $2.5 \times 10^{-2}$ Pa |
| Acceleration voltage of ion gun for evaporation | 1200 V |
| Ion current from ion gun for evaporation | 120 mA |
| Distance between target and substrates | 127 mm |

Corning-7059 glass was used for the substrate. The ferromagnetic tunneling effect film in this embodiment was produced by forming on a substrate 31 of a 100-nm thick lower magnetic layer 32 of Fe-1.0 at % C alloy, a 10-nm thick intermediate layer 33 of $Al_2O_3$, a 100-nm upper magnetic layer 34 of Fe-1.0 at % C alloy, and a 50-nm thick antiferromagnetic layer 35 of Cr in turn.

Figure 15:
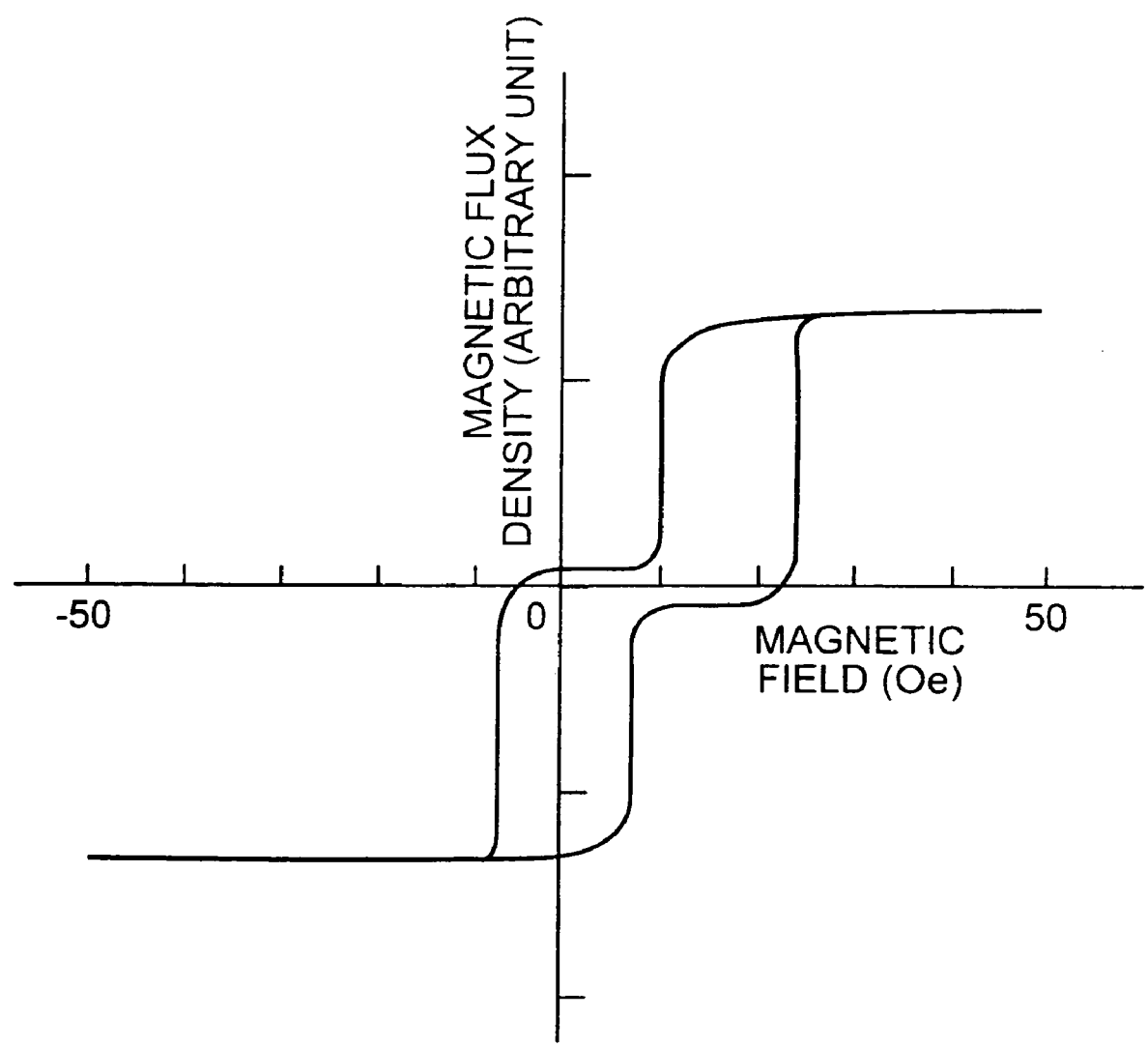
FIG. 15 is a graph showing the magnetization of the ferromagnetic tunneling film.

The magnetization curve of the ferromagnetic tunneling effect film was measured at a temperature of 4.2 K by a B-H curve tracer. FIG. 15 shows the measured magnetization curves. As shown in FIG. 15, the coercive forces of the lower magnetic layer 32 and the upper magnetic layer 34 are equally 7 Oe. However, a bias field is applied from the antiferromagnetic layer 35 to the upper magnetic layer 34, so that the magnitude of the magnetic field changing in the magnetization direction is shifted to the high magnetic field side. Therefore, when the magnetic field is increased from the negative to the positive side, the magnetization directions of the lower magnetic layer 32 and the upper magnetic layer 34 are antiparallel within the magnetic field range of 7 to 24 Oe, but are parallel within the other range. When the magnetic field is decreased from the positive to the negative side, the magnetization directions of the lower magnetic layer 32 and the upper magnetic layer 34 are antiparallel within the magnetic field range of −7 to 10 Oe, but are parallel within the other range.

It is considered that in the magnetic field in which the magnetization directions are antiparallel, the electrical resistance of the ferromagnetic tunneling effect film is high, but in the field in which the magnetization directions are parallel, the electrical resistance is low.

Figure 16:
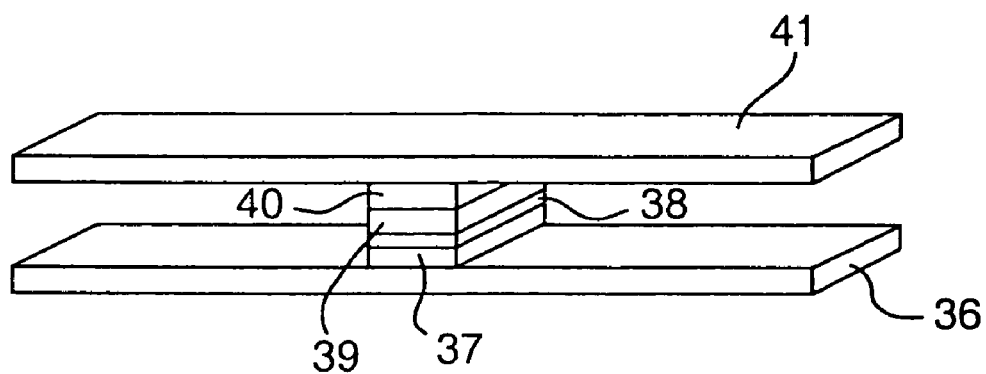
FIG. 16 is a perspective view of the structure of a magnetoresistance effect element of the third embodiment of the invention.

Thus, to examine the change of resistance of the ferromagnetic tunneling effect film, an element was produced as shown in FIG. 16. The process for producing this element will be described below. First, a Cu electrode 36 10 μm wide and 100 nm thick is formed on a nonmagnetic substrate by ion beam sputtering and ion milling. Then, on the Cu electrode 36, there are formed a 10 μm×10 μm×100-nm thick lower magnetic layer 37 of Fe-1.0 at % C alloy, a 10 μm×10 μm×10 μm thick intermediate layer 38 of $Al_2O_3$, a 10 μm×10 μm×100-nm thick upper magnetic layer 39 of Fe-1.0 at % C alloy, and a 10 μm×10 μm×50-nm thick antiferromagnetic layer 40 of Cr, in turn. Thereafter, the level differences, or steps, are flattened with a resin, and a Cu electrode 41 is formed to be in contact with the surface of the antiferromagnetic layer 40.

Figure 17:
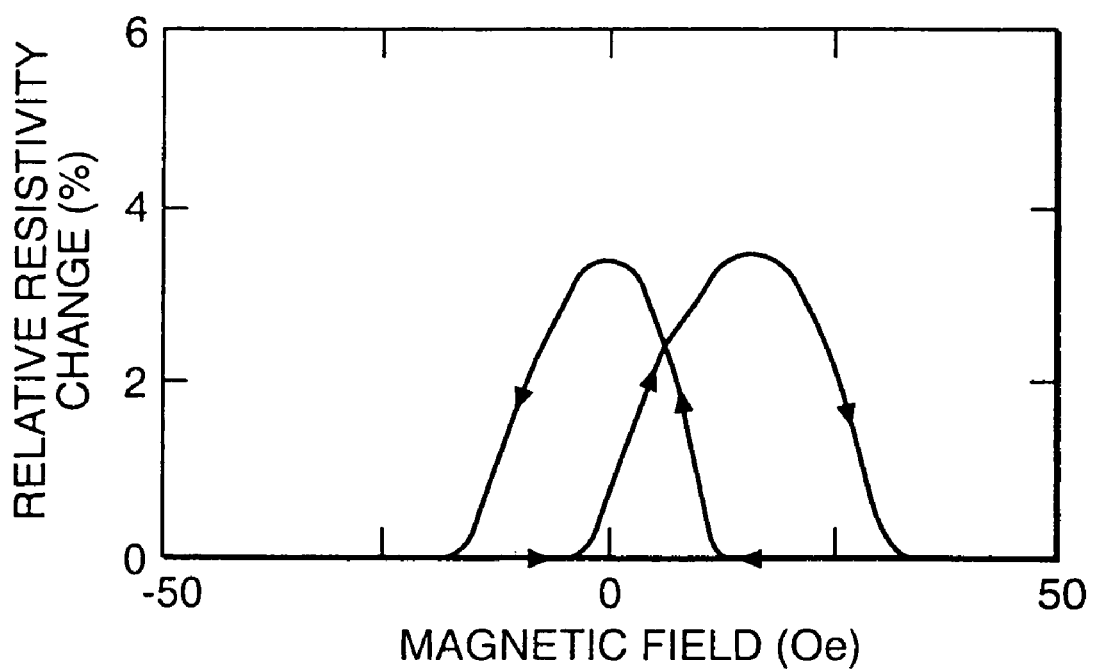
FIG. 17 is a graph showing the relation between the applied magnetic field and the rate of resistance change of a magnetoresistance effect element.

A magnetic field was applied to the Cu electrodes in the direction perpendicular to the longitudinal direction by use of a Helmholtz coil, and the change of electrical resistance was examined. The measurement was made at a temperature of 4.2 K. FIG. 17 shows the relation between the magnetic field and the electrical resistance. From FIG. 17, it will be seen that the electrical resistance of the element is changed with the magnitude of the magnetic field. The maximum relative resistivity change was about 3.6%.

The magnetic field strength at which the electrical resistance is the maximum is about 0 Oe and 16 Oe and thus lower than that of the conventional ferromagnetic tunneling effect film. This is because the magnetoresistance tunneling effect film of the embodiment is formed of only relatively low-coercive force magnetic layers. In the conventional ferromagnetic tunneling effect film, though, the coercive forces of the two magnetic layers must be different, and thus the magnetic field at which the element operates is large. On the other hand, since the ferromagnetic tunneling effect film of this embodiment is operated under a low magnetic field, the magnetoresistance effect element using this film is advantageous to the magnetic head as compared with the conventional one.

Moreover, the ferromagnetic tunneling effect film of this embodiment is formed on only a soft magnetic film. The soft magnetic film has a small magnetic anisotropy dispersion, and thus the magnetization direction of very small portions of each magnetic layer is just at an angle for the parallel or antiparallel, but difficult at an intermediate angle. Since the ferromagnetic spin-dependent tunneling effect depends on the direction of the magnetization of each magnetic layer, the magnetization is difficult at an intermediate angle. Thus, a ferromagnetic tunneling effect film formed on only a soft magnetic film as in this embodiment has a relatively large relative resistivity change.

Also, as in this embodiment, when at least part of the magnetoresistance effect film is formed on a nonmagnetic metal, all the current is passed through the intermediate layer, thus effectively detecting the magnetoresistance effect. Moreover, in the application to the magnetic head, if, as in this embodiment, at least part of the magnetoresistance effect film is formed on a nonmagnetic metal, the cross-sectional area of the magnetic layer facing the magnetic recording medium can be reduced so that the magnetic field from a narrow region can be detected.

In addition, while in this embodiment, the magnetic layers are formed of Fe-1.0 at % C alloy and the intermediate layer is formed of $Al_2O_3$, the magnetic layers and the intermediate layer may be formed on other magnetic materials and insulating material, respectively, in which case the same action can be achieved. If the antiferromagnetic layer is made of an antiferromagnetic material having a Noel point above the temperature at which the magnetoresistance effect is measured, the magnetoresistance effect can be achieved.

Also, while in this embodiment the antiferromagnetic layer is formed on the upper magnetic layer, it may be formed on the lower magnetic layer in which case the same effect can be achieved.

As a fourth embodiment of a magnetoresistance effect element of the invention, a magnetoresistance effect element was produced in the same way as in the third embodiment. The magnetic layers were Fe-1.0 at % C alloy and the intermediate layer was $Al_2O_3$. The antiferromagnetic layer was Cr-1 at % Ru alloy and Cr-25 at % Au alloy. The relative resistivity change of the magnetoresistance effect element of this embodiment was 1.5% at room temperature when the Cr-1 at % Ru alloy was used, and 1.8% when the Cr-25 at % Au alloy was used. In addition, the electrical resistance was the maximum when the magnetic field was substantially the same as in the element of the third embodiment.

As a fifth embodiment of a magnetoresistance effect element of the invention, a magnetoresistance effect element was produced in the same way as in the third embodiment. The magnetic layers were Fe-1.0 at % C alloy and the intermediate layer was $Al_2O_3$. The antiferromagnetic layer was Fe-50 at % Mn alloy. Moreover, a Ni-20 at % Fe alloy layer 5 nm thick was provided between the Fe-1.0 at % C alloy and the Fe-50 at % Mn alloy. The reason for this is as follows.

When the Fe-50 at % Mn alloy layer is formed on a body-centered cubic structure material, it easily forms an α-phase structure. The Néel temperature of the Fe—Mn-based alloy of the α-phase structure is lower than room temperature. On the contrary, the Fe-50 at % Mn alloy layer easily forms a γ-phase structure when formed on a face-centered cubic structure. The Néel temperature of the γ-phase-structured Fe—Mn-based alloy is higher than room temperature. Therefore, in order to obtain a magnetoresistance effect element operating at room temperature, an Ni-20 at % Fe alloy layer of face-centered cubic structure was provided between the Fe-1.0 at % C alloy layer and the Fe-50 at % Mn alloy layer.

The relative resistivity change of the magnetoresistance effect element of this embodiment was 1.6% at room temperature. The electrical resistance was the maximum when the magnetic field was substantially the same as in the element of the third embodiment.

As described in detail above, according to the second feature of the invention, even if the coercive forces of the two magnetic layers of the ferromagnetic tunneling effect film are not greatly different (e.g., the materials of the two layers are the same), application of a bias magnetic field from the antiferromagnetic material to one magnetic layer will change the magnetic field for changing the magnetization directions of the layer, thus providing the magnetoresistance effect. Moreover, if at least part of the ferromagnetic tunneling effect films formed on the nonmagnetic metal, the area of the magnetic layer facing the magnetic recording medium can be reduced, so that the magnetic field from a narrow region can be detected.

Figure 18:
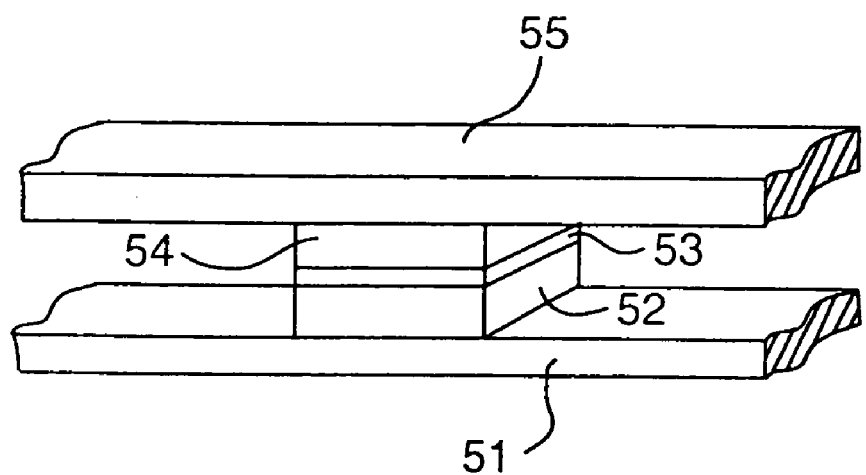
FIG. 18 is a perspective of the structure of a magnetoresistance effect element of a sixth embodiment of the invention.

FIG. 18 shows the structure of a sixth embodiment of a magnetoresistance effect element of the invention. A ferromagnetic tunneling effect element constituting the magnetoresistance effect element was produced by an ion beam sputtering apparatus under the following conditions:

| Ion gas | Ar |
| --- | --- |
| Ar gas pressure within the apparatus | $2.5 \times 10^{-2}$ Pa |
| Ion gun acceleration voltage for evaporation | 1200 V |
| Ion gun ion current for evaporation | 120 mA |
| Distance between target and substrates | 127 mm |

Corning-7059 glass was used for the substrate.

The ferromagnetic tunneling effect element constituting the magnetoresistance effect element of this embodiment is produced by forming on the substrate a 100-nm thick lower electrode 51 of Cu, a 100-nm thick lower magnetic layer 52 of Fe-1.7 at % Ru alloy, a 10-nm thick intermediate layer 53 of BN, a 100-nm thick upper magnetic layer 54 of Fe-2.0 at % C alloy, and a 100-nm thick upper electrode 55 of Cu, in turn. The working of each layer was performed by ion milling.

The resistivity change of the ferromagnetic tunneling effect element with the change of the magnetic field was measured at a temperature of 4.2 K. A current was flowed between the upper electrode 55 and the lower electrode 51, and the voltage between the electrodes was measured to detect the resistivity change.

Figure 19:
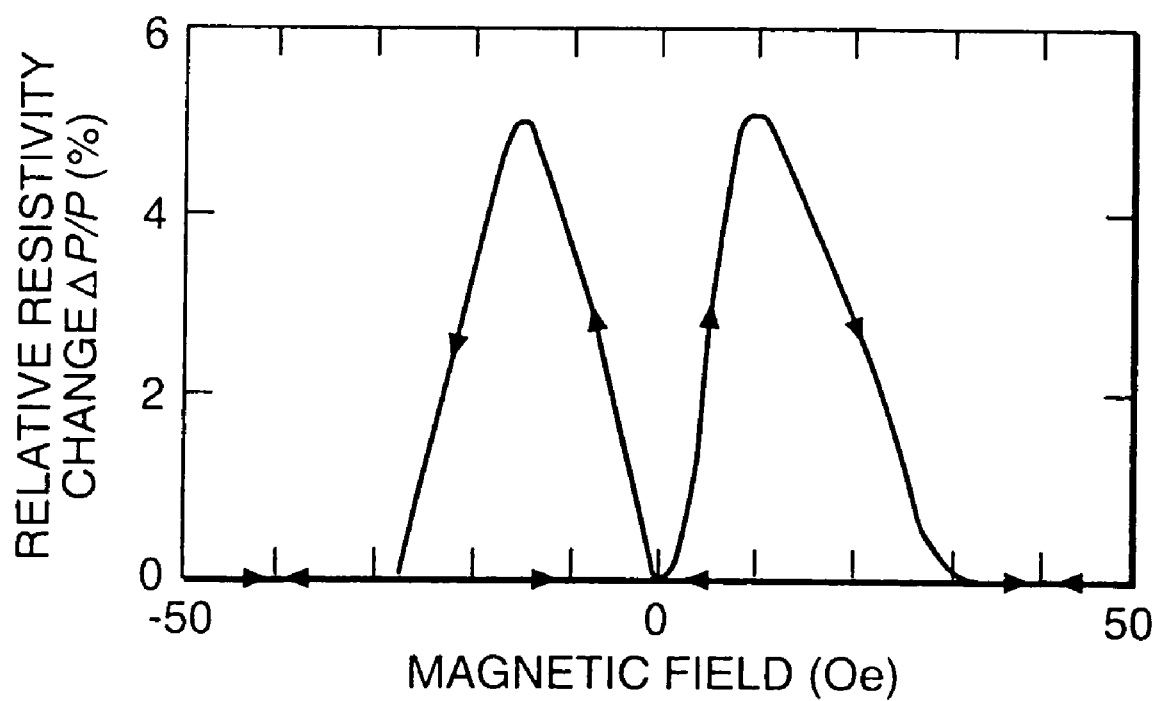
FIG. 19 is a graph showing the relation between the applied magnetic field and the relative resistivity change of a magnetoresistance effect element.

FIG. 19 shows the measured result. From FIG. 19, it will be seen that the electrical resistance of the element changes with the magnitude of the magnetic field. The maximum rate of change was about 5.1%. The magnitude of the magnetic field at which the electric resistance is the maximum is −15 Oe and 16 Oe. These values are substantially intermediate between the coercive force of 10 Oe of the upper magnetic layer 54 and the coercive force of 21 Oe of the lower magnetic layer 52.

The magnetic layer of the ferromagnetic tunneling effect element of this embodiment is formed of only an Fe-based alloy film. The Fe-based alloy film has a large polarization in the band structure and the ferromagnetic tunneling effect element has a relatively high relative resistivity change.

Moreover, if as in this embodiment, at least part of the ferromagnetic tunneling element is formed on a nonmagnetic metal, all the current flow is passed through the intermediate layer, thus effectively detecting the ferromagnetic tunneling effect. Also, in the application to the magnetic head, if at least part of the ferromagnetic tunneling effect element is formed on a nonmagnetic metal as in this embodiment, the cross-sectional area of the magnetic layer opposing to the magnetic recording medium can be reduced, so that the magnetic field from a narrow region can be detected.

Moreover, while in this embodiment, the magnetic layers were made of Fe-1.7 at % Ru alloy and Fe-2.0 at % C alloy, the magnetic layers may be made of other magnetic materials, in which case the same effect can be achieved.

As a seventh embodiment of a magnetoresistance effect element of the invention, a ferromagnetic tunneling effect element was produced in the same way as in the sixth embodiment. The magnetic layers were made of the same alloy materials as in the fifth embodiment and the intermediate layer was made of another compound than the C-alloy, oxide NiO, $Al_2O_3$ and the oxide according to this invention. The ferromagnetic tunneling effect element was produced at a temperature of 200 to 400° C.

Table 1 shows the maximum relative resistivity change of the ferromagnetic tunneling element with respect to the intermediate layer material and the production temperature.

|  | Intermediate layer material | Production temperature | | |
| --- | --- | --- | --- | --- |
|  |  | 200° C. | 300° C. | 400° C. |
| Prior art | C | 5.2% | 2.6% | 0.0% |
|  | NiO | 3.8% | 1.5% | 0.0% |
| This invention | Al$_2$O$_3$ | 3.5% | 3.6% | 3.5% |
|  | BN | 5.1% | 5.3% | 5.0% |
|  | B$_4$C | 5.2% | 5.5% | 5.0% |
|  | AlP | 4.8% | 5.0% | 5.0% |
|  | GaAs | 4.6% | 4.8% | 5.0% |

As listed in Table 1, at a production temperature of 200° C., the ferromagnetic tunneling element using the intermediate layer of other materials than oxides has a higher relative resistivity change than that using the oxide intermediate layer. This is probably because when an oxide intermediate layer is used, the interface energy is high between the magnetic layers, thus causing the magnetic layers to incur a defect which deteriorates the characteristics.

The ferromagnetic tunneling element using the C-alloy intermediate layer has a low relative resistivity change when produced at 300° C. or above. The reason for this is probably that the C-alloy is diffused into the magnetic layers due to heat and thus does not serve as the intermediate layer. On the contrary, the ferromagnetic tunneling element using a compound intermediate layer exhibits a high relative resistivity change even when produced at 300° C. or 400° C. This is probably because the compound intermediate layer has a high melting point; for example, the melting point of GaAs is 1238° C., the structure thus being stable against heating. Therefore, when a heating process is included in the production of the ferromagnetic tunneling element, the intermediate layer of the ferromagnetic tunneling element should be made of a compound.

As described in detail above, the third feature of this invention is that since the intermediate layer is made of one or more substances selected from carbides, borides, nitrides, phosphides and group IIIb to Vb elements, the soft magnetic characteristics of the magnetic layers are not deteriorated, and that the ferromagnetic tunneling element characteristics are not deteriorated even if the element is passed through the head production heating process. This is because the intermediate layer of a compound material has a low interface energy between the magnetic layers, thus preventing a defect from occurring in the magnetic layers, and because the intermediate layer of a compound material has a high melting point so that the elements in the intermediate layer are not diffused into the magnetic layers even when the tunneling element is passed through the heating process for magnetic head production.

FIGS. 20A to 20E show the structure of an eighth embodiment of a magnetoresistance effect element of the invention. The process for producing this embodiment will be described below.

As shown in FIG. 20A, a Cu film 61 of 10-μm width and 100-nm thickness is formed on a glass base (not shown). Then, as shown in FIG. 20B the central portion thereof is worked to have grooves by ion milling, and electrodes 62, 63, 64 and 65 are formed. The width of the grooves is 2 μm. The grooves are filled with an insulating material such as a resist, and then as shown in FIG. 20C a resist 66 of 2 μm×10 μm×300 μm height is formed by photolithography. Thereafter, as shown in FIG. 20D, a 3-nm thick Fe layer 67 and a 1-nm Cr layer 68 are alternately formed to produce a multilayered magnetic film by ion beam sputtering. Then, the upper surface of the whole element is flattened and the multilayered magnetic film is worked.

The above ion beam sputtering is performed under the following conditions:

| Ion gas | Ar |
| --- | --- |
| Ar gas pressure within the apparatus | 2.5 × 10$^{-2}$ Pa |
| Ion gun acceleration voltage for evaporation | 400 V |
| Ion gun ion current for evaporation | 60 mA |
| Distance between target and substrates | 127 mm |

Figure 20E:
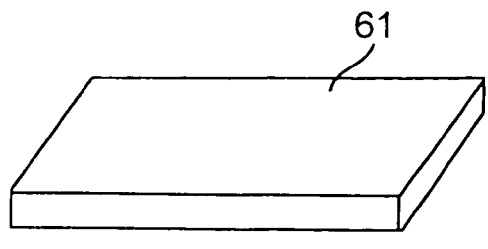
Figure 20E:
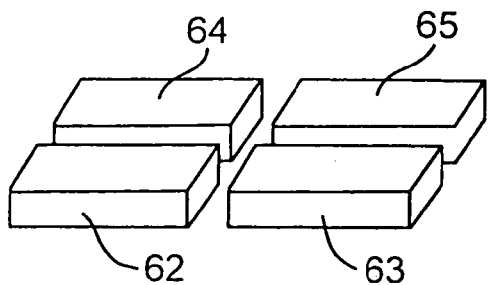
Figure 20E:
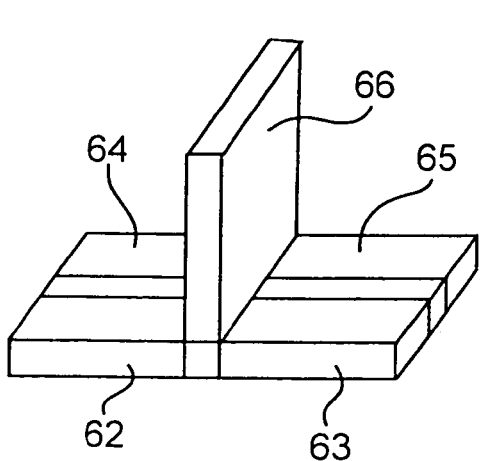
Figure 20E:
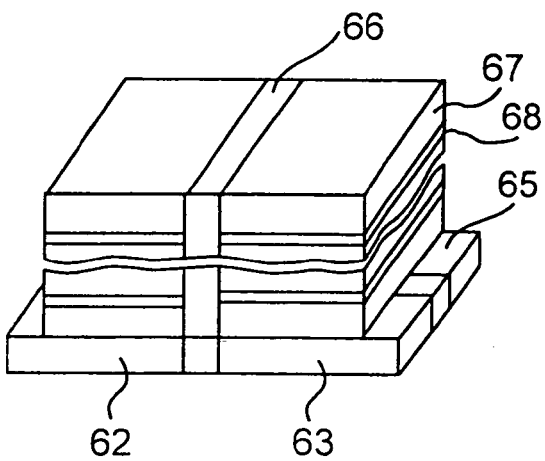
Figure 20E:
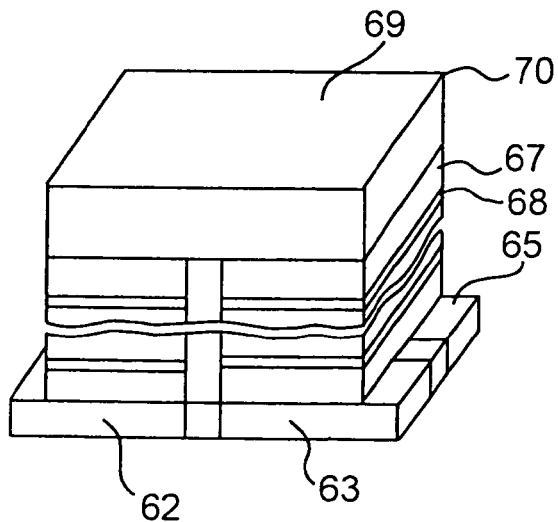

The whole thickness of the Fe/Cr multilayered magnetic film is about 200 nm. Moreover, the Fe/Cr multilayered magnetic film is 4 μm wide and 10 μm long. Furthermore, as shown in FIG. 20E, a 500-nm thick conductive layer 69 of Cu is formed thereon, and the multilayered magnetic films insulated by the resist 66 are electrically connected to complete a magnetoresistance effect element 70.

Figure 21:
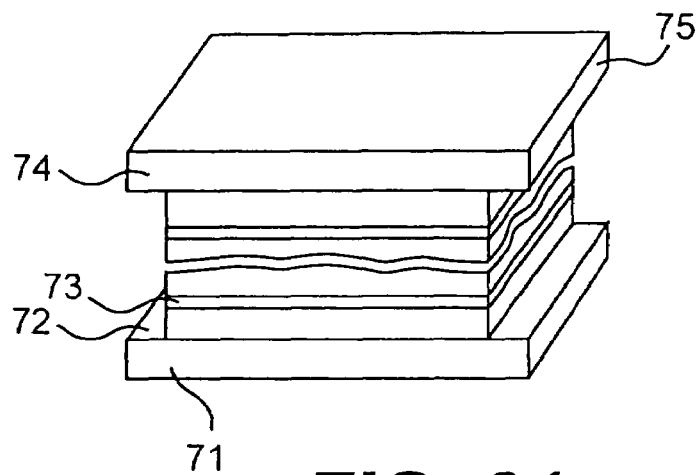
FIG. 21 is a perspective view of the structure of the conventional magnetoresistance effect element using the Fe/Cr multilayered films.

In addition, for comparison, a conventional magnetoresistance effect element 75 is produced as shown in FIG. 21. The process for producing this magnetoresistance effect element is as follows. On a lower Cu electrode 71 of 10-μm width and 100-nm thickness, are alternately formed a 3-nm thick Fe layer 72 and a 1-nm thick Cr layer 73 to produce a multilayered magnetic film of 10 μm×10 μm×200 μm. Moreover, an upper Cu electrode 74 of 10-μm width and 100-nm thickness is formed thereon to produce a magnetoresistance effect element 75.

The resistance of the magnetoresistance effect element 70 of this embodiment and the conventional magnetoresistance effect element 75 were measured. For the measurement, the electrodes 62, 63, 64, 65 and lower and upper electrodes 71, 74 were selected as voltage and current terminals, and the 4-terminal method was used. As a result, the resistance of the conventional magnetoresistance effect element 75 for comparison was 2.0×10$^{-4}$ Ω, and the resistance of the magnetoresistance effect element 70 of this invention was 3.5×10$^{-2}$ Ω.

Figure 22:
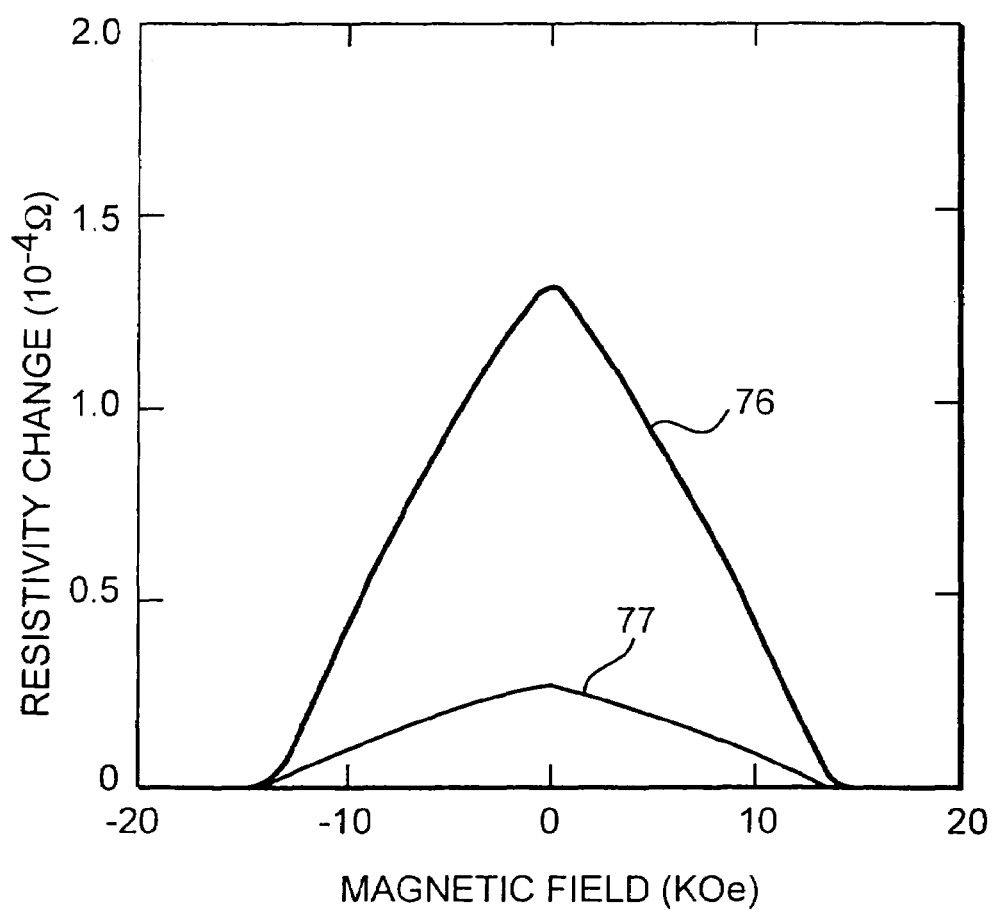
FIG. 22 is a graph showing the applied magnetic field vs. relative resistivity change of a magnetoresistance effect element of the invention and of the conventional one for comparison.

Also, measurement was made of the amount of resistivity change of the magnetoresistance effect element 70 of the embodiment and the conventional magnetoresistance effect element 75 for comparison with respect to the change of the applied magnetic field. The measurement was made at room temperature. FIG. 22 shows the measured result. From FIG. 22, it will be seen that the amount of resistivity change 76 of the magnetoresistance effect element 70 of this embodiment is about 5 times the amount of resistivity change 77 of the conventional magnetoresistance effect element 75 for comparison.

As described above, since the element using the Fe/Cr multilayered films is constructed so that electrons are passed a plurality of times through the nonmagnetic layer located at the same distance from the substrate, the electrical resistance of the whole element can be increased and greatly changed without increasing the thickness of the whole element. Since the thickness of the whole element is not changed, the resolution is not reduced relative to the magnetic field distribution in the wavelength direction when the element is used in a magnetic head.

Figure 23:
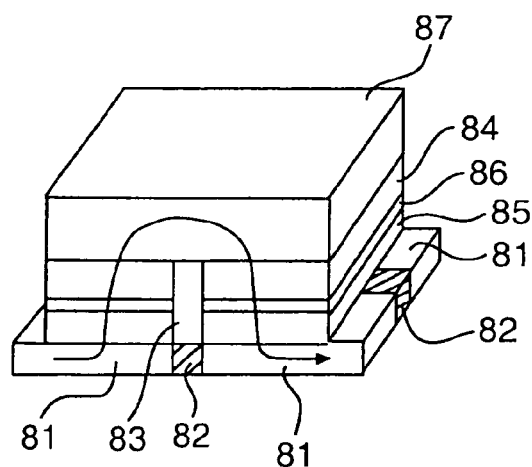
FIG. 23 is a perspective view of the ferromagnetic tunneling structure of a magnetoresistance effect element of a ninth embodiment of the invention.

FIG. 23 shows the structure of a ninth embodiment of a magnetoresistance effect element of this invention. This element has the same structure as the eighth embodiment, and uses the ferromagnetic tunneling effect. The magnetic layers are an Fe-1.7 at % Ru alloy layer 85 of 100-nm thickness and an Fe-2.0 at % C alloy layer 84 of 100-nm thickness. The nonmagnetic layer 86 is made of 10-nm thick $Al_2O_3$. The electrode 81 and the conductive layer 87 are made of Cu. Resists 82 and 83 are used as insulating materials.

A magnetic field from a Helmholtz coil was applied to the magnetoresistance effect element, and the change of electrical resistance was examined. As a result, it was found that the electrical resistance of the element changes with the change of the magnitude of the magnetic field.

The causes of the resistivity change are considered as follows.

By the measurement of the magnetization curves, it was found that the coercive force of the Fe-1.7 at % Ru alloy layer is 25 Oe, and that the coercive force of the Fe-2.0 at % C alloy layer is 8 Oe. When the magnitude of the magnetic field is changed, the magnetization direction of the Fe-2.0 at % C alloy layer is changed at 8 Oe, but the magnetization direction of the Fe-1.7 at % Ru alloy layer is not changed. When a magnetic field of 25 Oe or above is applied, the magnetization direction of the Fe-1.7 at % Ru alloy layer is changed. Therefore, in a magnetic field of ±8 to 25 Oe, the magnetization direction of the Fe-2.0 at % C alloy layer and the magnetization direction of the Fe-1.7 at % Ru alloy layer are antiparallel. Also, outside of this range of magnetic field, the magnetization directions are parallel. When a tunneling current is flowed in the $Al_2O_3$ layer, the conductance is higher when the magnetization directions are parallel than when they are antiparallel. Thus, the electrical resistance of the element is changed with the magnitude of the magnetic field.

Moreover, when the electrical resistivity change of the magnetoresistance effect element of the structure in which electrons are passed once through the $Al_2O_3$ was measured, the amount of resistivity change was ½ that of the magnetoresistance effect element of this invention. As described above, if the element is constructed so that electrons are passed a plurality of times through the nonmagnetic layer located at the same distance from the substrate, the electrical resistance of the whole element can be increased and a large amount of resistivity change can be achieved without increasing the thickness of the whole element. Since the thickness of the whole element is not changed, the resolution is not reduced relative to the magnetic field distribution in the wavelength direction when the element is used in a magnetic head.

Figure 24:
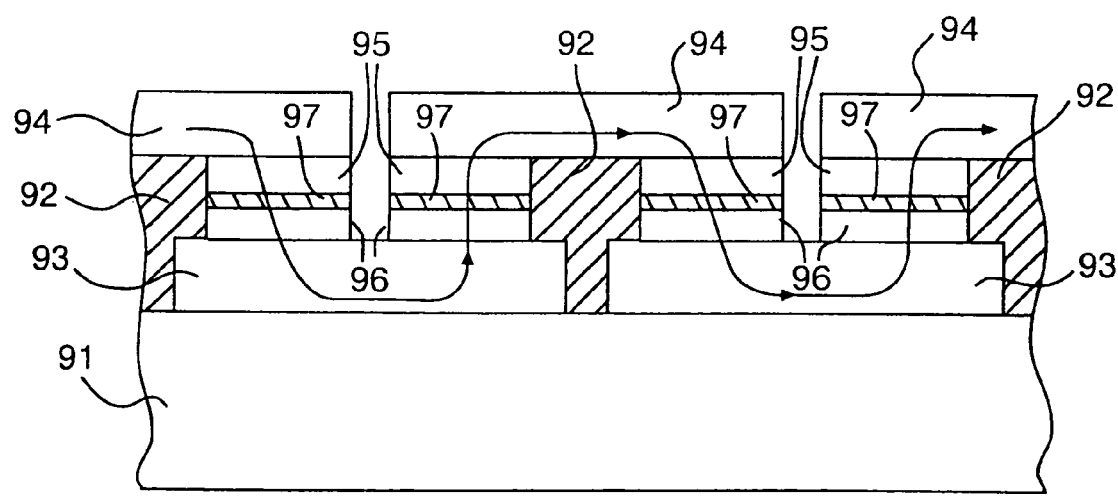
FIG. 24 is a cross-sectional diagram showing the ferromagnetic tunneling structure.

FIG. 24 shows the cross-sectional structure of a tenth embodiment of a magnetoresistance element of the invention. This element uses the ferromagnetic spin-dependent tunneling effect. The Corning-photoceram was used as a substrate 91. An insulator 92 was made of a resin. The conducting layers 93, 94 were made of Cu. The magnetic layers were a 100-nm thick Fe-2.0 at % C alloy layer 95 and a 100-nm thick Fe-1.7 at % Ru alloy layer 96. The nonmagnetic layer was a 10-nm thick $Al_2O_3$ layer 97.

As shown in FIG. 24, the magnetoresistance effect element of this embodiment has a plurality of ferromagnetic tunneling elements connected in series. Thus, the electrical resistance of the whole element becomes large, and the amount of resistivity change is large, so that the element is able to act as a high-sensitivity magnetic field sensor.

The series connection of the ferromagnetic tunneling elements may be made in any shape, but as the element is large, the resolution relative to the magnetic field distribution is decreased so that the element is not suitable for the magnetic head. However, the magnetic sensor which does not require the resolution relative to the magnetic field distribution is preferably formed with a magnetoresistance effect element having a great number of ferromagnetic tunneling elements connected in series as in this embodiment.

As described in detail, the fourth feature of the invention is that in the element having the Fe/Cr multilayered films and the element having the magnetoresistance effect due to the multilayered structure such as the ferromagnetic tunneling element, the electrical resistance and the amount of resistivity change of the whole element can be increased by series connection of a plurality of magnetoresistance effect elements. Moreover, when the element is so constructed that electrons are passed a plurality of times through the nonmagnetic layer located at the same distance from the substrate, the electrical resistance and the amount of resistivity change of the whole element can be increased without increasing the thickness of the whole element. Since the thickness of the whole element is not changed, the resolution is not decreased relative to the magnetic field distribution in the wavelength direction when the element is used in a magnetic head.

Figure 25A:
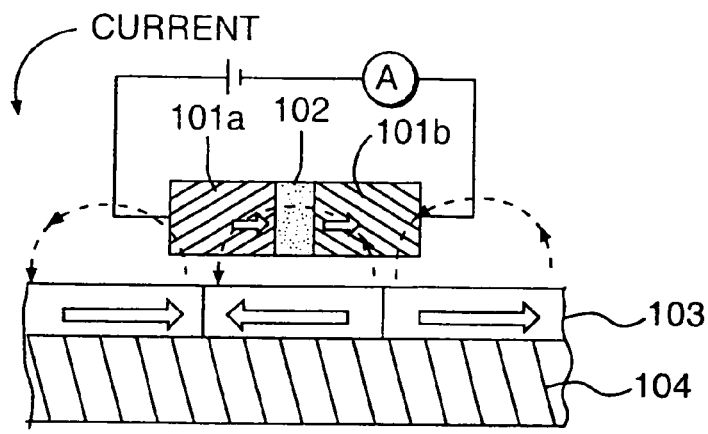
FIGS. 25A and 25B are diagrams useful for explaining the principle of the operation of a magnetic head of the invention.
Figure 25B:
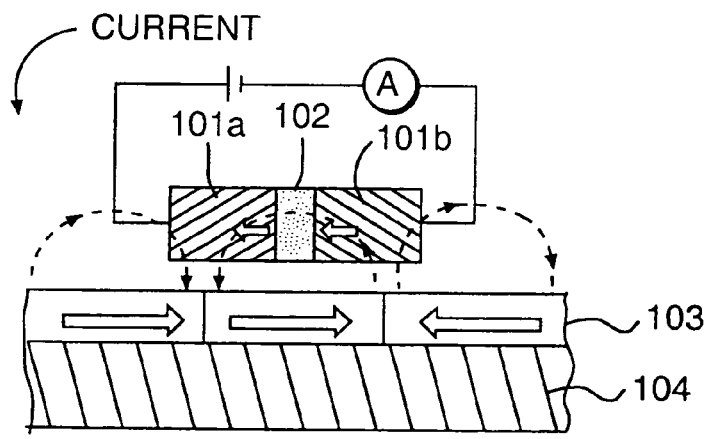
Figure 26:
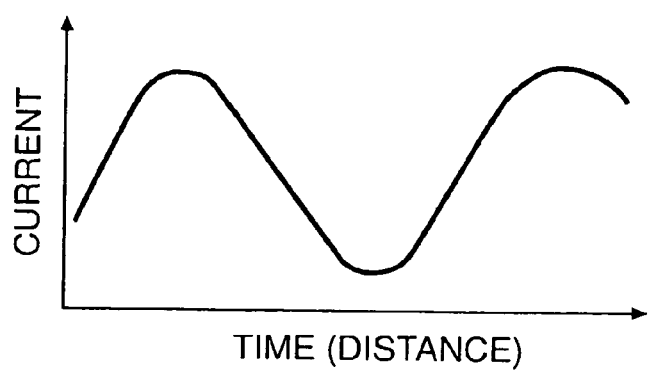
FIG. 26 is a graph showing the principle of the operation of a magnetic head.

Before the magnetic head of this invention is described, the principle of the magnetism detection will be described with reference to FIGS. 25A, 25B and 26. A magnetic sensing element is used which has ferromagnetic layers 101*a* and 101*b* connected in series through an electrically insulating film 102 as shown in FIGS. 25A and 25B. The thickness of the electrically insulating film 102 is in such a range from 0.5 nm to 10 nm that the tunneling current can be flowed in the film, preferably in a range from 1 nm to 6 nm. An electric circuit as shown in FIGS. 25A and 25B is connected to this multilayered element, and the current flowing through the circuit is measured. When this element is placed in the magnetic field leaked from a magnetic recording medium 103, a part of the ferromagnetic metal layers 101*a* and 101*b* which is made to contact with the electrically insulating film 102 is affected and magnetized by the leaked magnetic field. Under this condition, the tunneling current which reflects the electron state of the part of the ferromagnetic metal 101*a*, 101*b* in contact with the electrically insulating film 102 is flowed in the element. Under this electron state, the element is delicately affected not only by the temperature and crystalline property of the ferromagnetic metal but also by the magnetization state such as the magnetization direction and the presence of the magnetic wall.

When this element is placed, as shown in FIG. 25B, in a magnetic field opposite to that shown in FIG. 25A, the magnetization state of the ferromagnetic metal 101*a*, 101*b* is changed from the case of FIG. 25A. As a result, the electron state of the part of the ferromagnetic metal 101*a*, 101*b* in contact with the electrically insulating film 102 is changed, and the tunnel current is changed. That is, each time the multilayered element passes by the recorded bits periodically recorded on the magnetic recording medium, the current is changed in accordance with the magnetization direction of the recorded bits. FIG. 26 shows the change of the current. In FIGS. 25A and 25B, reference numeral 104 represents the base on which a magnetic recording medium 103 is formed.

The two ferromagnetic metal layers 101a, 101b stacked about the electrically insulating film 102 may be made of the same material, but in order to greatly change the current according to the change of magnetic field, the two metal layers are desired to be made of different materials having different work functions. The value of the tunneling current is affected not only by the thickness of the electrically insulating film 102 but also by the difference between the work functions of the ferromagnetic metal layers 101a and 101b. The work function difference is above 0.3 eV, preferably above 0.5 eV for the observation of a large current change.

Although the ferromagnetic layers 101a, 101b may be of crystalline property or noncrystalline property, in order to have a high-speed response to the direction change of the magnetic field leaking from the magnetic recording medium 103 it is desired that they be made of a soft magnetic material excellent in the high-frequency characteristic. The soft magnetic material may be Fe—, Co— or Ni-based material such as Fe, Fe—Ni, Co—Nb—Zr, Co—Nb—Ta, Fe—Si, Ni—Fe—B.

For measurement of the tunneling current, the electrically insulating film 102 shown in FIGS. 25A and 25B is not limited to a good insulating material such as $Al_2O_3$ or $SiO_2$, but may be a semiconductor or semimetal such as Si, B or GaAs. The specific resistance difference to the ferromagnetic metal 101a, 101b should be great.

While the electrically insulating film 102 for explaining the principle of the invention is single as shown in FIGS. 25A and 25B, a plurality of combinations of the ferromagnetic metal 101a, 101b and the electrically insulating film 102 may be provided from the principle point of view, and a magnetic artificial lattice can be effectively used.

An embodiment of the magnetic head of the invention will be described below.

Figure 27A:
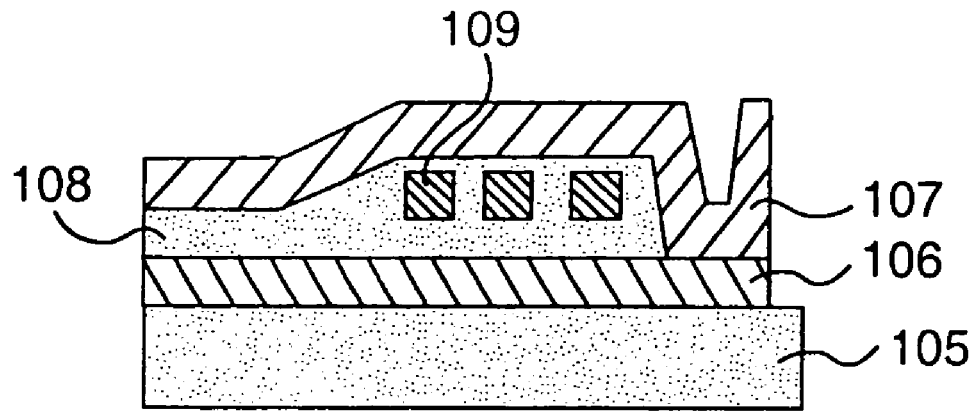
FIGS. 27A and 27B are cross-sectional views of a magnetic head.
Figure 27B:
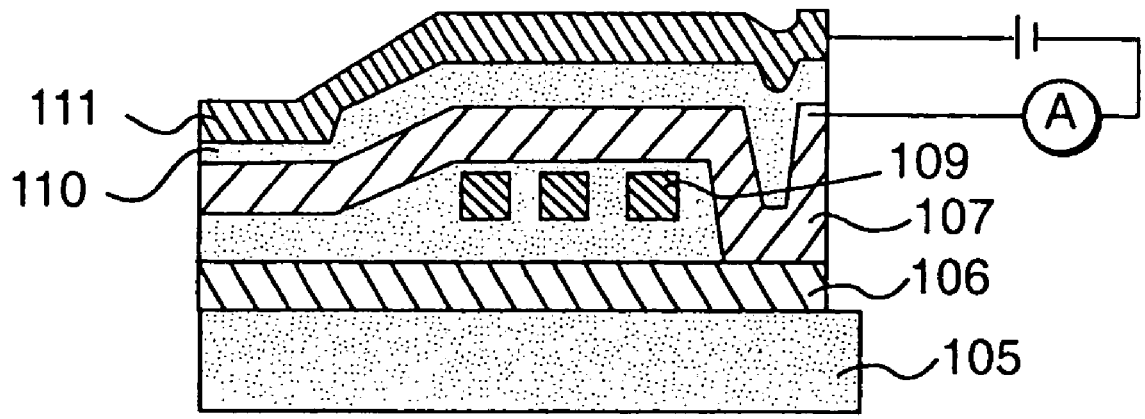

FIGS. 27A and 27B show the structure of a first embodiment of the magnetic head. This magnetic head is a thin film-type ring head, and the cross-sectional structure is shown in FIG. 27A. A substrate 105 of this thin-film type ring head is made of Mn—Zn ferrite material, and a lower magnetic pole 106 and an upper magnetic pole 107 are made of Permalloy material and are 20 μm and 15 μm thick, respectively. The material in the gap 108 is $Al_2O_3$, the gap distance is 0.5 μm, and the coil 109 is made of Cu.

On the thin-film type ring head is formed an electrically insulating film 110 which is made of $Al_2O_3$ and of which the thinnest part has a thickness of 3 nm. On this insulating film is formed a 15-μm ferromagnetic material 111 which is made of Fe—Si—Al.

FIG. 27B shows the magnetic head produced by the above process. This magnetic head uses its thin-film ring head as a recording element. The ferromagnetic material 111 formed thereon through the electrically insulating film 110 and the upper magnetic pole 107 of the thin-film ring head are paired to form a reproducing element for the dual-element magnetic head. This magnetic head uses the upper magnetic pole of the thin-film ring head as part of the element structure for recording and reproducing, and thus the whole construction of the magnetic head can be simplified.

The ferromagnetic material of the top layer as shown in FIG. 27B is selected to be Permalloy (Fe—Ni), Fe, Fe—Si, Ni, Ni—Fe—B, Co, Co—Nb—Zr, Co—Ta—Zr, and the other portions of the magnetic head are the same as described above.

The characteristics of the magnetic head are evaluated under the following conditions. The magnetic recording medium used is a 5-inch diameter rigid magnetic disk. The magnetic films are a Co—Ni-based medium (having a surface direction coercive force of 900 Oe and a saturated magnetization of 600 emu/cc) as an in-plane magnetized film and a Co—Cr-based medium (having a vertical direction coercive force 700 Oe and a saturated magnetization of 520 emu/cc) as a perpendicular magnetized film. The spacing between the head and the medium is selected to be 0.15 μm, and the relative moving speed is 15 m/s. The recording density is selected to be 1 kFCI and 50 kFCI, and the thin-film ring head is used for recording.

The signal/noise ratio (S/N) of the reading output is measured. For comparison, the thin-film ring head for recording is used for reading and the S/N ratio is measured and used. Tables 2 and 3 list the measured results of the Co—Ni-based in-plane magnetized film and Co—Cr-based perpendicular magnetization film, respectively. In the tables, the difference between the work functions is of the Permalloy of the ferromagnetic material 111 and the upper magnetic pole 107.

TABLE 2

Recording medium: Co—Ni-based surface magnetized film

Ferromagentic materials and work function difference (eV)

| Recording density | Ring head (for reference) | Permalloy | Fe—Si—Al | Fe—Si | Fe | Ni | Ni—Fe—B | Co | Co—Nb—Zr | Co—Ta—Z |
|---|---|---|---|---|---|---|---|---|---|---|
|  |  | — | 0 | 0.55 | 0.3 | 0.2 | 0.1 | 0.6 | 1.2 | 0.9 | 0.85 |
| 1 kFCI | 1 | 2.6 | 5.3 | 4.0 | 3.2 | 2.2 | 4.6 | 2.0 | 9.4 | 8.6 |
| 50 kFCI | 0.8 | 2.2 | 5.0 | 3.9 | 2.6 | 1.7 | 4.1 | 1.6 | 9.0 | 7.8 |

TABLE 3

Recording medium: Co—Cr-based perpendicular magnetized film

Ferromagentic materials and work function difference (eV)

| Recording density | Ring head (for reference) | Permalloy | Fe—Si—Al | Fe—Si | Fe | Ni | Ni—Fe—B | Co | Co—Nb—Zr | Co—Ta—Z |
|---|---|---|---|---|---|---|---|---|---|---|
|  | — | 0 | 0.55 | 0.3 | 0.2 | 0.1 | 0.6 | 1.2 | 0.9 | 0.85 |
| 1 kFCI | 1 | 2.1 | 5.0 | 3.9 | 3.0 | 2.0 | 4.4 | 1.6 | 6.8 | 8.1 |
| 50 kFCI | 0.9 | 1.6 | 4.6 | 3.4 | 2.1 | 1.3 | 4.0 | 1.1 | 5.2 | 6.9 |

Figure 28A:
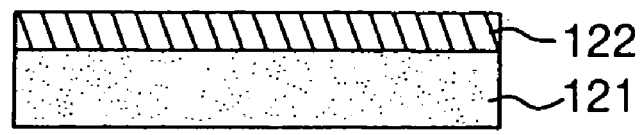
FIGS. 28A, 28B and 28C are cross-sectional diagrams showing the manufacturing process of a magnetic head.
Figure 28B:
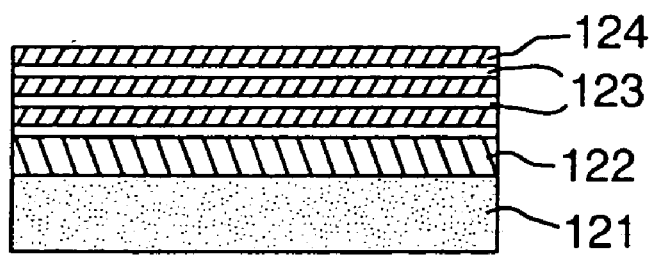
Figure 28C:
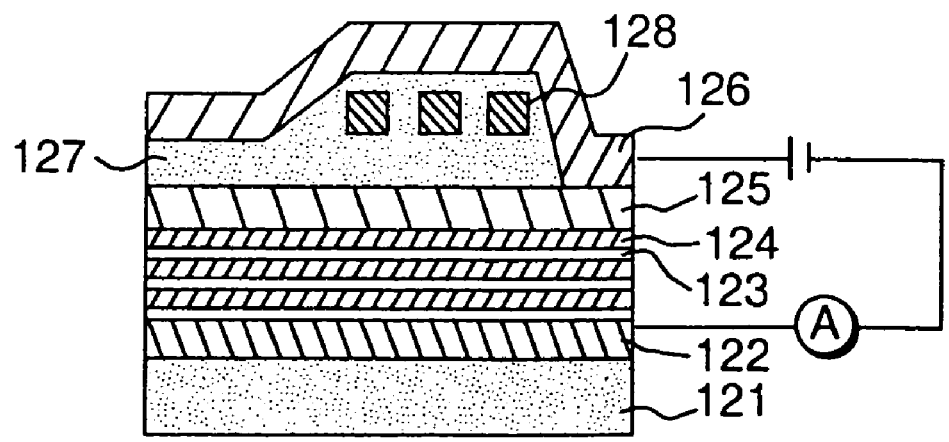

FIGS. 28A, 28B and 28C show the structure of a second embodiment of the magnetic head. The substrate 121 is made of sapphire. The Fe film of a ferromagnetic material 122 is first deposited to a thickness of 20 μm by sputtering (FIG. 28A), and a 2-nm thick semiconductor 123 of Si and a 10-nm ferromagnetic material 124 of Fe—C are alternately formed, for a total of three layers formed in turn (FIG. 28B). Then, a lower magnetic pole 125 of Permalloy, a gap 127 of $Al_2O_3$, a coil 128 of Cu and an upper magnetic pole 126 of Co—Nb—Zr are provided thereon in turn by the normally used thin-film manufacturing technology. FIG. 28C shows the magnetic head produced by the above process.

The magnetic head of this embodiment, of which the electrically insulating film to be interposed between the ferromagnetic materials is changed to a semiconductor, was evaluated under the same conditions as in the first embodiment. The result was that even in any case of the Co—Ni-based in-plane magnetized film and the Co—Cr-based perpendicular magnetization film, when the medium recorded at a linear recording density of 1 kFCI, 50 kFCI was reproduced, the S/N ratio was at least 3 times larger than the S/N ratio reproduced by the conventional ring head.

A third embodiment of the magnetic head will be described below.

The electrically insulating material 110 of the magnetic head is made of $SiO_2$, MnO, NiO, BeO, $SiO_2$—$Al_2O_3$, Mn—Zn ferrite, $Y_2O_3$, $ZrO_2$, $TiO_2$ in place of $Al_2O_3$ in the first embodiment. The Mn-Zn ferrite is a ferromagnetic material but an electrically insulating material which can be used as an electrically insulating film as the other oxides are used as electrically insulating materials.

A fourth embodiment of the magnetic head will be mentioned.

The electrically insulating film 110 in the first embodiment is made of Si, B, BN in place of $Al_2O_3$.

The characteristics of the magnetic heads produced in the third and fourth embodiments are evaluated under the same conditions as in the first embodiment. The change of the current flowing between the ferromagnetic material 111 (FIG. 27B) and the upper magnetic pole is measured. The S/N ratio of either magnetic head is at least twice the S/N ratio of the thin-film ring head.

Thus, the fifth feature of this invention is that when the magnetically recorded information is reproduced, the S/N ratio is much greater than that of the reproduced signal by the conventional ring head. The construction is simple, and the reproducing element of this embodiment can be easily provided to be overlapped on the recording element. Thus, the dual-element magnetic head for both recording and reproducing can be produced by a simple process. Since the S/N ratio upon reproduction can be greatly improved by use of the magnetic head according to this embodiment, the high-density magnetically recorded medium can be reproduced even when the spacing between the magnetic head and the recording medium is slightly large. Thus, the probability of an accident such as head crush can be reduced. When this magnetic head is used in magnetic disk apparatus, the reliability of the apparatus and the magnetic writing and reading characteristics of the apparatus for high-density recorded regions can be greatly improved.

What is claimed is:

1. In a magnetic apparatus of the type having a perpendicular magnetic recording medium and a magnetic head arranged to perform reproduction from the perpendicular magnetic recording medium, the improvement wherein:

said magnetic head includes a reproducing element, wherein said reproducing element has a magnetic-resistance element including a first non-magnetic metal layer, a second non-magnetic metal layer, and a magneto-resistance effect film formed between the first non-magnetic metal layer and the second non-magnetic metal layer, said magneto-resistance effect film includes a first ferromagnetic layer, a second ferromagnetic layer, and an intermediate insulating layer formed between the first ferromagnetic layer and the second ferromagnetic layer, and said magneto-resistance effect film is arranged so that a tunnel current flows between the first ferromagnetic layer and the second ferromagnetic layer through the intermediate insulating layer, wherein a magnetization direction of said second ferromagnetic layer is fixed by an anti-ferromagnetic layer which applies a bias magnetic field to the second ferromagnetic layer.

2. The magnetic apparatus according to claim 1, wherein said intermediate insulating layer contains $Al_2O_3$.

3. A magnetic apparatus according to claim 1, wherein a magnetization direction of said first ferromagnetic layer changes in the presence of a changing external magnetic field.

4. A magnetic apparatus comprising:

a perpendicular magnetic recording medium; and a magnetic head including a reproducing element arranged to perform reproduction from the perpendicular magnetic recording medium, wherein said reproducing element has a magnetic-resistance element including a first non-magnetic metal layer, a second non-magnetic metal layer, and a magneto-resistance effect film formed between the first non-magnetic metal layer and the second non-magnetic metal layer, said magneto-resistance effect film includes a first ferromagnetic layer, a second ferromagnetic layer, and an intermediate insulating layer formed between the first ferromagnetic layer and the second ferromagnetic layer, and said magneto-resistance effect film is arranged so that a tunnel current flows between the first ferromagnetic layer and the second ferromagnetic layer through the intermediate insulating layer, wherein a magnetization direction of said second ferromagnetic layer is fixed by an anti-ferromagnetic layer which applies a bias magnetic field to the second ferromagnetic layer.

5. The magnetic apparatus according to claim 4, wherein said intermediate insulating contains $Al_2O_3$.

6. A magnetic apparatus according to claim 4, wherein a magnetization direction of said first ferromagnetic layer changes in the presence of a changing external magnetic field.

7. A magnetic apparatus according to claim 4, wherein said perpendicular magnetic recording medium has a perpendicular magnetic recording layer comprising Co—Cr.

* * * * *